(12) United States Patent
Burke et al.

(10) Patent No.: US 7,074,639 B2
(45) Date of Patent: Jul. 11, 2006

(54) FABRICATION OF A HIGH-PRECISION BLOOMING CONTROL STRUCTURE FOR AN IMAGE SENSOR

(75) Inventors: Barry E. Burke, Lexington, MA (US); Eugene D. Savoye, Lancaster, PA (US)

(73) Assignee: Massachusetts Institute of Technology, Cambridge, MA (US)

( * ) Notice: Subject to any disclaimer, the term of this patent is extended or adjusted under 35 U.S.C. 154(b) by 957 days.

(21) Appl. No.: 10/023,387

(22) Filed: Dec. 17, 2001

(65) Prior Publication Data
US 2002/0048837 A1 Apr. 25, 2002

Related U.S. Application Data

(62) Division of application No. 09/204,483, filed on Dec. 3, 1998, now Pat. No. 6,331,873.

(51) Int. Cl.
*H01L 21/00* (2006.01)

(52) U.S. Cl. ............................ 438/79; 438/75; 438/524; 438/525

(58) Field of Classification Search ............ 438/75–79, 438/433, 514, 524, 525, 526, 531; 257/223, 257/230
See application file for complete search history.

(56) References Cited

U.S. PATENT DOCUMENTS

| | | | |
|---|---|---|---|
| 3,863,065 A | 1/1975 | Kosonocky et al. | |
| 3,873,371 A | 3/1975 | Wolf | |
| 3,914,857 A | 10/1975 | Goser et al. | |

(Continued)

FOREIGN PATENT DOCUMENTS

DE 2341179 3/1975

(Continued)

OTHER PUBLICATIONS

Hori et al., ,"A New Submicron MOSFET with LATID (LArge-Tilt-Angle Implanted Drain)," Symposium on VLSI Technology, IEE & JSAQP, vol. Symp. 8, pp. 15-16, May 1988.

(Continued)

*Primary Examiner*—Kevin M. Picardat
(74) *Attorney, Agent, or Firm*—Theresa A. Lober

(57) ABSTRACT

Provided is a method of fabrication of a blooming control structure for an imager. The structure is produced in a semiconductor substrate in which is configured an electrical charge collection region. The electrical charge collection region is configured to accumulate electrical charge that is photogenerated in the substrate, up to a characteristic charge collection capacity. A blooming drain region is configured in the substrate laterally spaced from the charge collection region. The blooming drain region includes an extended path of a conductivity type and level that are selected for conducting charge in excess of the characteristic charge collection capacity away from the charge collection region. A blooming barrier region is configured in the substrate to be adjacent to and laterally spacing the charge collection and blooming drain regions by a blooming barrier width. This barrier width corresponds to an acute blooming barrier impurity implantation angle with the substrate. The blooming barrier region is of a conductivity type and level that is selected based on the blooming barrier width to produce a corresponding electrical potential barrier between the charge collection and blooming drain regions. The blooming barrier regions of the structure are very precisely defined by the selected acute blooming barrier impurity implantation angle, and optionally in addition by a rotation of the blooming barrier impurity implantation, as well as a non-vertical sidewall profile of the an impurity implantation masking layer.

22 Claims, 14 Drawing Sheets

U.S. PATENT DOCUMENTS

| | | | |
|---|---|---|---|
| 4,450,484 A | 5/1984 | Terakawa et al. | |
| 4,579,626 A | 4/1986 | Wallace | |
| 4,593,303 A | 6/1986 | Dyck et al. | |
| 4,607,429 A | 8/1986 | Kosonocky et al. | |
| 4,658,497 A | 4/1987 | Savoye et al. | |
| 4,974,043 A * | 11/1990 | Stevens | 257/234 |
| 5,045,906 A * | 9/1991 | Nagaya | 257/230 |
| 5,047,359 A | 9/1991 | Nagatomo | |
| 5,051,797 A * | 9/1991 | Erhardt | 257/230 |
| 5,051,798 A | 9/1991 | Kimura | |
| 5,118,631 A | 6/1992 | Dyck et al. | |
| 5,122,850 A | 6/1992 | Burkey | |
| 5,124,557 A | 6/1992 | Aitken | |
| 5,160,846 A | 11/1992 | Ray | |
| 5,264,707 A | 11/1993 | Akiyama et al. | |
| 5,270,226 A | 12/1993 | Hori et al. | |
| 5,349,216 A | 9/1994 | Lee et al. | |
| 5,372,957 A | 12/1994 | Liang et al. | |
| 5,444,007 A | 8/1995 | Tsuchiaki | |
| 5,500,868 A | 3/1996 | Kurihara | |
| 5,518,941 A | 5/1996 | Lin et al. | |
| 5,567,632 A | 10/1996 | Nakashiba et al. | |
| 5,569,946 A | 10/1996 | Hong | |
| 5,614,744 A | 3/1997 | Merrill | |
| 5,619,049 A | 4/1997 | Kim | |
| 5,714,776 A | 2/1998 | Banghart et al. | |
| 5,736,416 A | 4/1998 | Johansson | |
| 5,804,465 A | 9/1998 | Banghart et al. | |
| 5,827,774 A | 10/1998 | Kitajima | |
| 5,849,605 A | 12/1998 | Yamada | |
| 6,266,087 B1 * | 7/2001 | Hynecek et al. | 257/230 |
| 6,331,873 B1 | 12/2001 | Burke et al. | |
| 2001/0019361 A1 * | 9/2001 | Savoye | 348/222 |

FOREIGN PATENT DOCUMENTS

| | | |
|---|---|---|
| JP | 3142841 | 6/1991 |
| JP | 9289309 | 11/1997 |

OTHER PUBLICATIONS

Patent Abstracts of Japan, vol. 1998, No. 3, Feb. 1998.

Burke et al., "Large-Area Back-Illuminated CCD Imager Development," iin Optical Detectors for Astronomy, Beletic et al., Eds., pp. 19-28, Kluwer Academic Publishers, Netherlands, 1998.

Savoye et al., High sensitivity charge-coupled devie (CCD) imagers for television, SPIE vol. 501, "State-of-the-Art Imaging Arrays and Their Applications," pp. 32-39, 1984.

* cited by examiner

FIG. 14

FABRICATION OF A HIGH-PRECISION BLOOMING CONTROL STRUCTURE FOR AN IMAGE SENSOR

CROSS-REFERENCE TO RELATED APPLICATIONS

This application is a divisional of U.S. application Ser. No. 09/204,483, filed Dec. 3, 1998 now U.S. Pat. No. 6,331,873.

STATEMENT REGARDING FEDERALLY-SPONSORED RESEARCH

This invention was made with U.S. Government support under U.S. Air Force Contract Number F19628-95-C-0002. The U.S. Government has certain rights in this invention.

BACKGROUND OF THE INVENTION

This invention relates to image sensors such as CCD imagers, and more particularly relates to structures for controlling charge blooming in an image sensor.

The charge-coupled-device (CCD) imager, a common image sensor configuration, typically consists of an array of isolated channels in a semiconductor substrate. In operation of a conventional n-type channel CCD imager, exposure of the substrate, here p-type, to illumination from a scene to be imaged results in photogeneration of electrons in the substrate and collection of the electrons in packets in the channels. Distinct pixel regions of collected electron packets along the channels are controlled by application of appropriate voltages to gate electrodes provided on the substrate surface over the channel pixel regions. An image of a scene is thus produced by collection of pixel electron packets in response to scene illumination and timed transfer of the electron packets from the channels to electronics configured for sensing each pixel's accumulated charge packet level.

Each pixel region along a channel has a finite charge storage capacity; that is, there is a definable maximum amount of photogenerated charge that can be accumulated in a given pixel region during an illumination period. This pixel capacity is defined by geometric, impurity doping, biasing, and other characteristics of the channel. Due to this limitation, high-intensity illumination conditions in the region of a given pixel can produce a level of photogenerated charge that exceeds the charge storage capacity of that pixel.

To illustrate this condition, and referring to FIG. 1A, there is shown a high-intensity illumination spot 10 on a selected pixel region, defined by a corresponding gate electrode 12, over a location of a CCD channel 14, which can be formed as a surface channel or a buried channel, in the conventional manner. The channel 14 consists of, e.g., an n-type region defined between channel stops 16, 18, of opposite conductivity type, i.e., p-type regions. When the accumulated photogenerated charge under the gate electrode 12 exceeds the storage capacity of that pixel region, the charge packet 20 spreads, or "blooms" to neighboring pixel regions under gate electrodes 22, 24, 26, 28 and so on along the channel. The blooming charge corrupts the neighboring pixels' charge level correspondence to local illumination intensity and can saturate one pixel or a region of pixels. In severe cases the blooming charge can flood a substantial fraction of imager pixels and obscure a major potion of a scene to be imaged.

The charge blooming phenomenon is cosmetically objectionable for broadcast television and other such commercial applications, and scene lighting is typically controlled in such applications to minimize blooming conditions. But for many scientific and military applications, the brightness range of a scene being imaged is not generally controllable. Indeed, in many astronomy and space surveillance applications, the range of brightness of stars and other illuminated objects can be so large that imager blooming conditions are inevitable, resulting in the danger of regions of interest in the scene being obscured during a critical scene monitoring operation.

A range of integrated structures have been proposed and demonstrated for providing blooming control in an image sensor such as a CCD imager. The operation of one class of blooming control structures, namely, a lateral blooming control structure, such as that described by, e.g., Savoye et al., in "High sensitivity charge-coupled device (CCD) imagers for television," *SPIE* V. 501, pp. 32–39, 1984, is illustrated in FIG. 1B. Here a CCD channel 14, e.g., an n-type buried channel, is flanked on each side by a blooming control structure consisting of a blooming drain 30 (and 36) and blooming barrier regions 32, 34 (and 38, 40). The impurity doping of the blooming drain and barrier regions, and the voltage, $V_{BD}$, applied to the blooming drain region are all selected such that for a given voltage, $V_G$, applied to the gate 12 of a pixel at which a high-intensity illumination spot 10 is located, charge in excess of the pixel capacity, i.e., blooming charge 20, will preferentially flow to the blooming drains 30, 36, rather than to neighboring pixel regions. The excess charge in the blooming drains is dumped to a location away from the buried channel pixel regions, e.g., at the periphery of the imager.

In the manner of a MOSFET, the channel with its reservoir of accumulated charge is here an electron source, the blooming drain is a drain, and the pixel gate electrode is a transistor gate. The blooming barrier region in this scenario is the transistor channel. The threshold voltage of this MOSFET-like configuration depends on the bias of the source, drain, and gate terminals, and the electrical characteristics of the blooming barrier region. Specifically, for a given bias, the blooming barrier region sets the electrical potential at which charge from the pixel region can flow to the blooming drain region, and the blooming barrier region therefore sets the charge capacity of the pixel.

For many applications precise control of the pixel charge capacity as set by the blooming potential barrier is imperative. An important and common concern is the relative potential energies of the blooming barrier height and of substrate surface states. The filling of surface states with charge from a pixel region can cause the known residual image effect, in which surface state charge may not completely empty from the surface states as quickly as does the other accumulated charge in the pixel region, resulting in the residual addition of this charge to charge packets collected in the pixel at later times. It is preferred that the potential barrier height be higher than the potential energy level of the surface states to minimize the filling of those states. Generally, to avoid surface-state trapping the charge-packet potential, and thus the potential barrier, should be at least 10 kT higher than the potential at the surface.

The potential barrier of the blooming barrier region is a critical function of both the doping concentration distribution and the lateral width, or extent, of the doping distribution in the barrier region between the channel and the blooming drain. The doping concentration distribution impacts the potential barrier height directly, and the geometric extent of the barrier region can indirectly impact the barrier height as a result of the known short-channel effect. The short-channel effect, named for the phenomenon in which the drain voltage of a transistor affects the transistor threshold voltage, occurs when the blooming barrier region is relatively narrow. With a relatively narrow blooming barrier region, the potential barrier, and pixel charge capacity, can be modulated by changes in the bias applied to the blooming drain. This control enables fine tuning of the barrier height to precisely define the pixel charge capacity and is desirable for many imaging applications where, e.g., the optimum charge storage capacity of a pixel can change over time. Fine tuning of the blooming barrier height is also desirable for compensation of imager variation across an imager production run. For example, in a CCD camera mass production operation, the characteristic CCD gate threshold voltage can vary from CCD chip to chip, requiring the fine tuning of CCD clock voltages, of which there may be several, on each chip to optimally set the blooming control on that chip. Fine tuning of the blooming control level by control of the blooming drain voltage, instead of the multiple clock voltages, is more efficient and more controllable.

There have been developed a number of techniques for producing a lateral blooming control structure like that of FIG. 1B to control the potential barrier height and charge capacity limit set by a blooming barrier region. For example, Wallace in U.S. Pat. No. 4,362,575; Wallace in U.S. Pat. No. 4,579,626; and Savoye et al. in U.S. Pat. No. 4,658,497, all describe fabrication processes in which first the blooming drain is formed by vertical ion implantation of a suitable dopant through an opening in two masking layers and then the blooming barrier region is formed by vertical ion implantation of a suitable dopant through the opening after the opening is enlarged and the top masking layer removed. Walls of the enlarged opening may be tapered to correspondingly taper the stopping power effect of the masking layer at the edges of the opening.

Dyck et al. in U.S. Pat. Nos. 4,593,303; and 5,118,631; describe a fabrication process in which the blooming drain is formed by vertical ion implantation of a suitable dopant through an opening, here in a single masking layer. The blooming barrier region is then formed by vertical ion implantation of a suitable dopant through the same opening, after which the dopant is diffused, during a high-temperature step, isotropically beyond the drain region in the substrate.

The Wallace and Savoye processes, requiring two masking layers and two mask etch steps in formation of the blooming control structure, are somewhat limited in their range and attainable precision of the resulting structure geometry. The precision of the two mask opening etch steps determines the lateral width of the blooming barrier and the dopant distribution at the edge of the barrier, and given a wet etch of a lower masking layer consisting of oxide, as suggested, very precise control of these factors is not guaranteed. In addition, these multi-step etch processes require a high degree of process control to achieve reproducibility. Any variation in enlargement of the masking layer opening, and any variation in the opening wall profile, can severely impact characteristics of the blooming barrier region from one fabrication sequence to the next.

Similarly, the Dyck process, by employing a thermal diffusion step to define the barrier region width, does not enable high-precision in impurity dopant distribution control, specifically, e.g., because the dopant may segregate to any dielectric layer on the substrate surface during the diffusion step. The Dyck process also does not provide flexibility in precisely distributing the dopant, due to the inherently isotropic nature of the diffusion step. In addition, the Dyck high-temperature diffusion step is not optimal for current fabrication processes, due to the increased thermal stress it can place on the substrate, and due to a possible conflict with the diffusion extent of other impurity dopant regions in the device.

These examples highlight the limitations in flexibility and precision of impurity dopant distribution typical of conventional processes for forming blooming control structures. Such limitations are found to correspondingly limit the operational characteristics of image sensors in which the structures are implemented.

SUMMARY OF THE INVENTION

The present invention overcomes limitations of prior blooming control structures to provide a semiconductor imaging device and blooming control structure in which characteristics of the blooming barrier region, and thus the blooming control operation, can be flexibly and precisely controlled. This is accomplished with a structure produced in a semiconductor substrate in which is configured an electrical charge collection region. The electrical charge collection region is configured to accumulate electrical charge that is photogenerated in the substrate, up to a characteristic charge collection capacity. A blooming drain region is configured in the substrate laterally spaced from the charge collection region. The blooming drain region includes an extended path of a conductivity type and level that are selected for conducting charge in excess of the characteristic charge collection capacity away from the charge collection region.

A blooming barrier region is configured in the substrate to be adjacent to and laterally spacing the charge collection and blooming drain regions by a blooming barrier width. This barrier width corresponds to an acute blooming barrier impurity implantation angle with the substrate. The blooming barrier region is of a conductivity type and level that is selected based on the blooming barrier width to produce a corresponding electrical potential barrier between the charge collection and blooming drain regions.

This blooming control structure, and particularly the blooming barrier regions of the structure, are very precisely defined in accordance with the invention with the specification of the corresponding acute blooming barrier impurity implantation angle. The limitations in impurity profile that are characteristic of prior blooming control structures are overcome by this correspondence between implantation angle and blooming barrier width.

Further in accordance with the invention, the depth in the substrate of the blooming barrier region corresponds to the blooming barrier impurity implantation angle. In addition, the blooming barrier width further can correspond to a non-vertical profile of an impurity implantation masking layer, and can correspond to a blooming barrier impurity implantation rotation. In one embodiment, the blooming barrier impurity implantation angle corresponds to a blooming barrier region width that exhibits a short-channel effect.

In the imaging device and blooming control structure, the substrate can be of a first conductivity type, e.g., p-type, with the charge collection and blooming drain regions each of a second conductivity type, e.g., n-type. The blooming barrier region can be of either conductivity type, and can specifically be of the second conductivity type, e.g., n-type. The electrical charge collection region can form a buried channel for a charge-coupled imaging device; can form a MOS or photodiode charge collection region for a MOS imaging device, or can form another suitable type of charge collection region.

The substrate can be configured to accept illumination on a side opposite that to which the charge collection region is more closely spaced. Here a photogenerated charge barrier region can be configured in the substrate at a depth below that of the blooming drain and blooming barrier regions. The photogenerated charge barrier region is of a conductivity type and level selected to deflect photogenerated charge in the substrate away from the blooming drain region and toward the charge collection region. In preferred embodiments, the photogenerated charge barrier region is characterized by a width and a depth in the substrate that each correspond to the blooming barrier impurity implantation angle.

In a method of fabricating the imaging device blooming control structure of the invention, there is to be provided a semiconductor substrate in which is configured a photogenerated electrical charge collection region. A masking layer, e.g., photoresist, is formed on the substrate, and an opening is provided in the masking layer at a substrate location selected for a blooming drain. A blooming drain is then formed by implanting an impurity into the substrate at the location of the masking layer opening, e.g., by a vertical implantation step. Then, a blooming barrier region is formed laterally adjacent to the blooming drain by implanting an impurity into the substrate at a first acute angle with the substrate to produce a lateral blooming barrier region width that corresponds to the first acute implantation angle. The angled impurity implantation can be rotated.

The opening provided in the masking layer has sidewalls that in one embodiment are characterized by a non-vertical profile. The masking layer can consist of at least two stacked masking layers, each characterized by a distinct impurity implantation stopping power. Here each masking layer in the stack can be provided with an opening having sidewalls of a distinct, non-vertical profile. Further, the opening in each of the stacked masking layers can be of a distinct size.

In one embodiment, a photogenerated charge barrier region is formed at a substrate depth lower than that of the blooming drain and the blooming barrier regions, either by the implantation of the impurity at the first acute angle with the substrate, or by implantation of the impurity at a second acute angle with the substrate. In either case, the lateral width of the photogenerated charge barrier region corresponds to the selected implantation angle.

This process can be applied in accordance with the invention to a general method of fabricating an impurity region in a semiconductor substrate. A masking layer is formed on the substrate, and a sidewall is formed in the masking layer at a substrate location for the impurity region. Then based on the impurity implantation stopping power of the masking layer and the masking layer sidewall profile, an acute impurity implantation angle with the substrate is selected—the acute angle specifically corresponds to a prespecified three-dimensional impurity region profile desired to be formed in the substrate. An impurity is then implanted into the substrate at the selected acute impurity implantation angle to produce the prespecified impurity region profile in the substrate.

The various alternatives described above can here be applied to the masking layer, sidewall profile, and implantation steps. In addition, the sidewall profile of the masking layer can form an opening in the layer, can form a masking mesa out of the layer, or can produce another suitable configuration on which an acute impurity implantation angle is to be selected. The substrate and implanted impurity can each of be either n-type or p-type conductivity; e.g., the substrate can be a first conductivity type, e.g., n-type, with the impurity being of a second conductivity type, e.g., p-type.

This fabrication process and the resulting structure, as particularly applied to the formation of an imaging device and a blooming control structure, enables the ability to precisely tailor the distribution profile of the implanted impurity in a manner that results in a high degree control of the operational device characteristics. CCD, MOS, and other imager configurations, as well as transistor devices, and passive structures such as resistors and capacitors are well-addressed by the structure designs and fabrication processes of the invention. Other features and advantages of the invention will be apparent from the following description and accompanying drawings, and from the claims.

BRIEF DESCRIPTION OF THE DRAWINGS

FIG. 14 is a plot of blooming barrier potential experimentally measured as a function of CCD gate voltage for three different blooming drain bias voltages;

DETAILED DESCRIPTION OF THE INVENTION

Figure 1A:
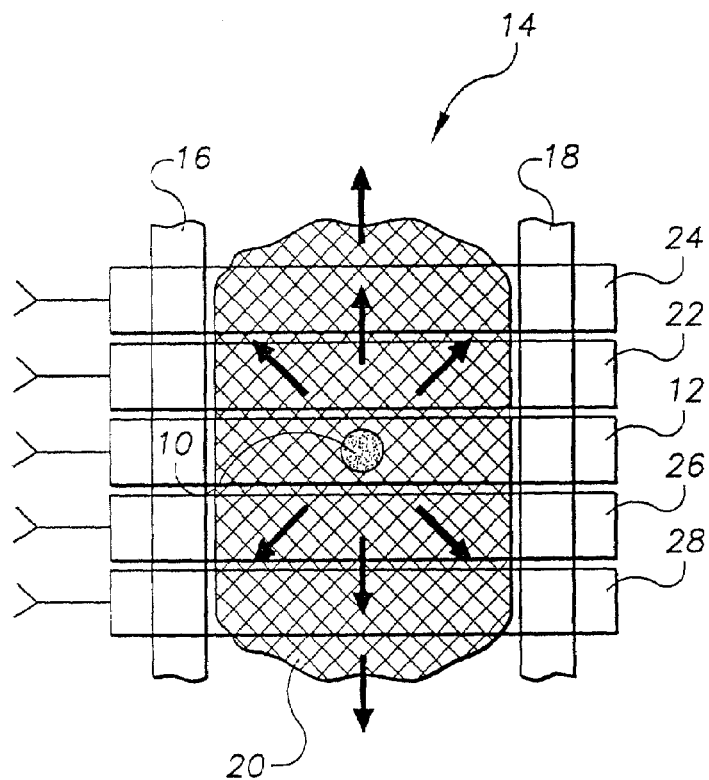
FIG. 1A is a schematic view of a prior art CCD channel in which charge is blooming between pixel locations in the channel.
Figure 1B:
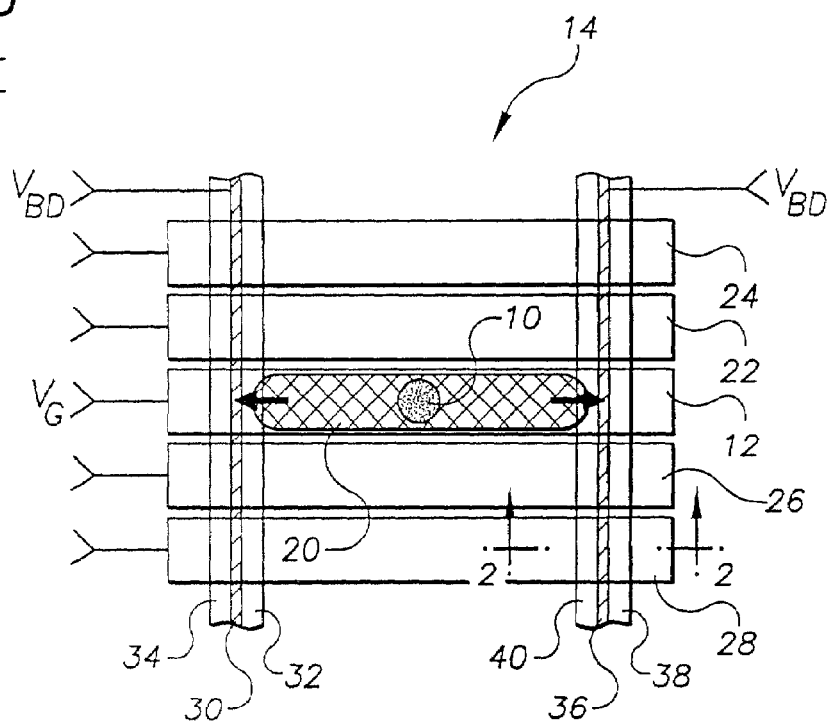
FIG. 1B is a schematic view of a prior art blooming control structure being employed to preferentially direct blooming charge from one pixel to blooming drains.
Figure 2:
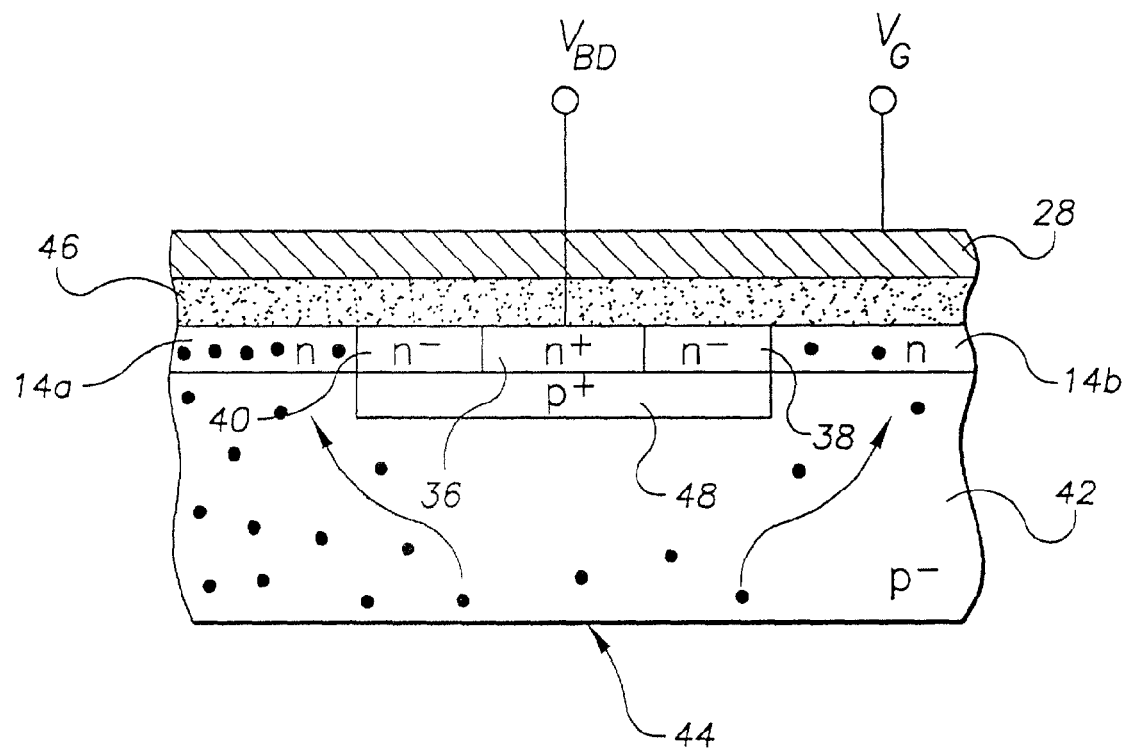
FIG. 2 is a cross sectional view of the blooming control structure of the invention as it would appear if substituted for the blooming control structure of FIG. 1B taken at sectional line 2–2' in FIG. 1B for the case of an n-buried-channel device.

An example high-precision blooming control structure in accordance with the invention and as-integrated with a CCD imager is schematically shown in FIG. 2, which is a cross-sectional view of the blooming control structure of the invention as it would appear if substituted for the blooming control structure of FIG. 1B, the view taken at the indicated location in FIG. 1B. In this example, an n-type buried channel, backside-illuminated CCD configuration is assumed, but it is to be understood that the blooming control structure of the invention is not limited to such. Surface channel, front-illuminated CCD configurations, CMOS configurations, and other imager configurations in which photogenerated charge is collected in a substrate are all well-addressed by the invention, as explained in detail later in the description.

The example structure of FIG. 2 is fabricated on, e.g., a lightly-doped p-type silicon substrate 42, the backside 44 of which is configured for exposure to illumination. In response to such exposure, electrons are photogenerated in the substrate, as indicated by the dots in the figure. N-type buried channels 14a, 14b are provided for collection of the photogenerated electrons. A gate electrode 28 is located on the substrate surface for electrically biasing the region of each channel that is under the gate by application of a gate voltage, $V_G$, to electrically define a pixel in that region As is conventional, an insulating layer 46 dielectrically isolates the gate electrode from the substrate.

A heavily doped, n-type blooming drain 36 is provided in the vicinity of the buried channels, and is flanked by adjacent blooming barrier regions 38, 40, shown here for example as lightly doped n-type regions, each of which laterally separate the drain 36 from the channels 14a, 14b. Schematically shown is an electrical connection to the blooming drain for applying a blooming drain bias, $V_{BD}$. This connection is made in practice to, e.g., a contact at the imager periphery. Under the blooming drain and the blooming barriers, at a lower substrate depth, is located a heavily-doped p-type region 48 provided to function as a photoelectron barrier for deflecting photogenerated electrons toward the buried channels, as explained below.

The electrical potential levels of each of the regions as described below, are set based on the doping levels selected for the regions. The substrate is typically lightly doped, at about, e.g., $10^{14}$ to $10^{15}$ cm$^{-1}$, and the buried channels are also of a relatively light doping, e.g., about $10^{16}$ cm$^{-3}$. The doping level of the blooming drain is fairly noncritical so long as the drain is relatively heavily-doped, e.g., at least about $10^{18}$ cm$^{-3}$. The drain is preferably heavily-doped to provide a low electrical resistance for transferring excess electrons along the drain away from the pixel regions. In a large imager it can be required to extend each blooming drain over a relatively long distance across the substrate, resulting in a significant series resistance. If a substantial photocurrent from blooming charge does flow along the drain, the electrical potential along the drain will drop, possibly enough that the electrical potential of the drain falls out of its required operating range. Heavy doping of the drain region minimizes this effect. The blooming barrier regions 38, 40 can be formed as either n-type or p-type, depending on the desired potential barrier height, and are relatively lightly doped with a precise doping distribution that results in a desired potential barrier height. An example barrier region doping range is between about $10^{15}$ and about $10^{16}$ cm$^{-3}$.

The photoelectron barrier region 48 is heavily-doped and of the conductivity type opposite that of the buried channels. As explained above, the photoelectron barrier deflects photogenerated electrons toward the buried channels. Without such a barrier, the photogenerated electrons would be strongly attracted to the heavily doped n-type blooming drain, resulting in diminished charge accumulation in the buried channels and a corresponding reduction in quantum efficiency. The doping level of the photoelectron barrier is therefore preferably high enough to produce a sufficiently high potential barrier to the blooming drain for photoelectrons from below, e.g., at an impurity concentration that is about 1000 times higher than that of the substrate, or about $10^{17}$ cm$^{-3}$ to about $10^{18}$ cm$^{-3}$ for the example substrate doping concentration given above. The photoelectron barrier doping level is also preferably sufficiently high such that the photoelectron barrier region is not completely depleted of charge by the electric field associated with the blooming drain located above the barrier. Other details of the photoelectron barrier characteristics are presented by Savoye et al. in U.S. Pat. No. 4,658,497, entitled "Method of making an imaging array having a higher sensitivity," the entirety of which is hereby incorporated by reference. As can be recognized, the photoelectron barrier is a feature that is specific to back-illuminated imagers, and such is not required for conventional front-illuminated imagers.

Figure 3:
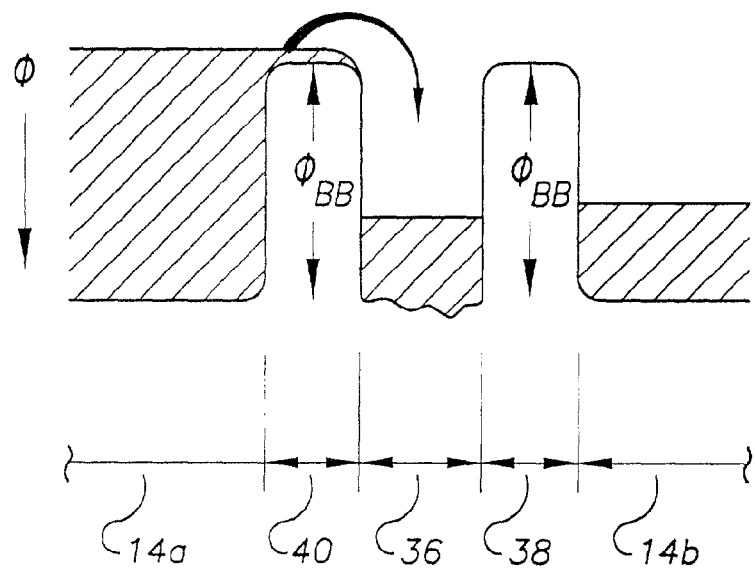
FIG. 3 is a potential energy diagram corresponding to the blooming control structure regions of FIG. 2.

With this impurity doping scenario, the operation of the blooming control structure and the photoelectron barrier can be understood by also referring to FIG. 3, in which there is shown an electrical potential diagram illustrating the electrical potential, $\phi$, corresponding to the device regions of FIG. 2 for reasonable gate and blooming drain bias voltages; increase in potential is downward in the figure. The electrical potential of the lightly-doped blooming barrier regions is less than the more moderately doped channel regions, and is much less than the heavily doped blooming drain region. This difference in potential results in a blooming barrier, $\phi_{BB}$, located laterally between each of the channels and the blooming drain, and which sets the charge storage capacity of the buried channel pixel regions.

In the example scenario of FIGS. 2 and 3 the left channel region 14a is shown to be accumulating more charge than the right channel region 14b to the point of having exceeded its capacity for charge storage. This is indicated in FIG. 3 by the cross-hatching of the left channel region extending above the adjacent blooming barrier, $\phi_{BB}$. The excess electrons from the filled channel region 14a are attracted to the high-potential blooming drain region, to which they flood. The right channel 14b is shown to be filled below its charge capacity, whereby the charge in this region is laterally constrained by the blooming barrier. This illustration highlights the criticality of precise control of the blooming barrier, $\phi_{BB}$, in setting the charge capacity of the pixel regions. Any adjustment in the barrier height directly impacts the pixel packet size of a channel region.

Figure 4:
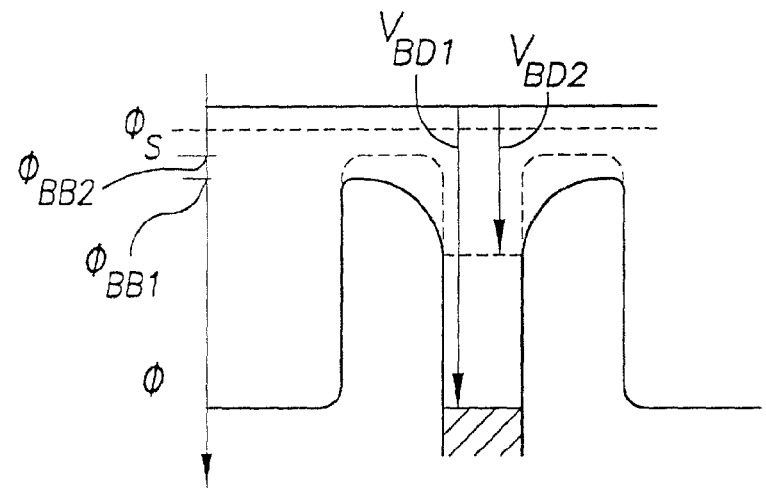
FIG. 4 is a potential energy diagram illustrating the potential energy of surface states and illustrating the short-channel effect across a blooming barrier region.

Beyond the effects on barrier height of both the impurity doping distribution and concentration, the applied blooming drain bias can effect the barrier height of relatively narrow barrier regions, due to the short-channel effect. Referring to FIG. 4, this is schematically illustrated for a first drain voltage, $V_{BD1}$, and a second, lower drain voltage, $V_{BD2}$. The first drain voltage, $V_{BD1}$, produces a corresponding blooming barrier, $\phi_{BB1}$. A decrease in the drain bias voltage to a lower voltage, indicated as $V_{BD2}$, results in an increase of the blooming barrier to $\phi_{BB2}$, due to the very heavy doping of the drain region and the more moderate doping of the channel region.

This phenomenon can be advantageously exploited to fine tune the blooming barrier in an effort to account for various material characteristics. For example, referring to FIG. 4, there is indicated the electrical potential, $\phi_S$, of surface states of the substrate in which the imager is fabricated. As explained above, it is preferable to set the lowest pixel charge potential at a level just above the surface state potential level to avoid populating the surface states. In order to "fine tune" the blooming barrier relative to a surface state potential, a blooming barrier region doping and lateral width can be selected for a given blooming drain bias, $V_{BD1}$, to produce a blooming barrier potential, $\phi_{BB1}$, that is safely higher in potential than the surface state potential. Then, given that the barrier region width is below a maximum for the short-channel effect, the drain bias can be tuned to a lower level, e.g., $V_{BD2}$, to adjust the lowest pixel charge potential level until the corresponding blooming barrier potential, e.g., $\phi_{BB2}$, is just above the surface state potential. In this way, the pixel charge capacity is fine tuned by the drain voltage based on the blooming barrier region doping concentration as well as width. It is thus shown that electrical and geometric characteristics of the blooming barrier region are important for enabling high-precision tuning of imager pixel charge capacity.

Referring back to the blooming control structure of FIG. 2, the fabrication processes provided by the invention enable precise and flexible control of the characteristics of the blooming barrier regions 38, 40 to enable the fine tuning discussed above, e.g., by way of a structure that exhibits the short-channel effect. In designing the structure and fabrication sequence for a selected blooming control structure, for, e.g., an n-type buried channel imager as in FIG. 2, ion implantation of an n-type impurity can be carried out to produce the buried channels 14a, 14b. Localized ion implantation of a high-dose of n-type impurity can then be employed to produce the blooming drain 36 at a desired location to separate the channels with the drain.

The blooming barrier regions 38, 40 straddling the drain are in general to be a light doping concentration, and can be n-type or p-type, depending on the desired potential barrier of the regions, as explained above. For the example n-type channel imager, this requires a compensating p-type ion implantation at the channel region locations where it is desired to form the blooming barrier regions. The net doping of the blooming barrier regions is thus the difference in impurity concentration between the buried channel implantation and the compensation implantation. For process efficiency, it is preferable that the compensating implantation, being p-type, also produce the buried photoelectron barrier region 48 underlying the blooming drain and barrier regions. In this scenario, three impurity ion implantations produce four distinctly doped regions. The compensation implantation is therefore to be precisely tailored to result in a doping distribution that meets the blooming control as well as the photoelectron barrier requirements.

Figure 5:
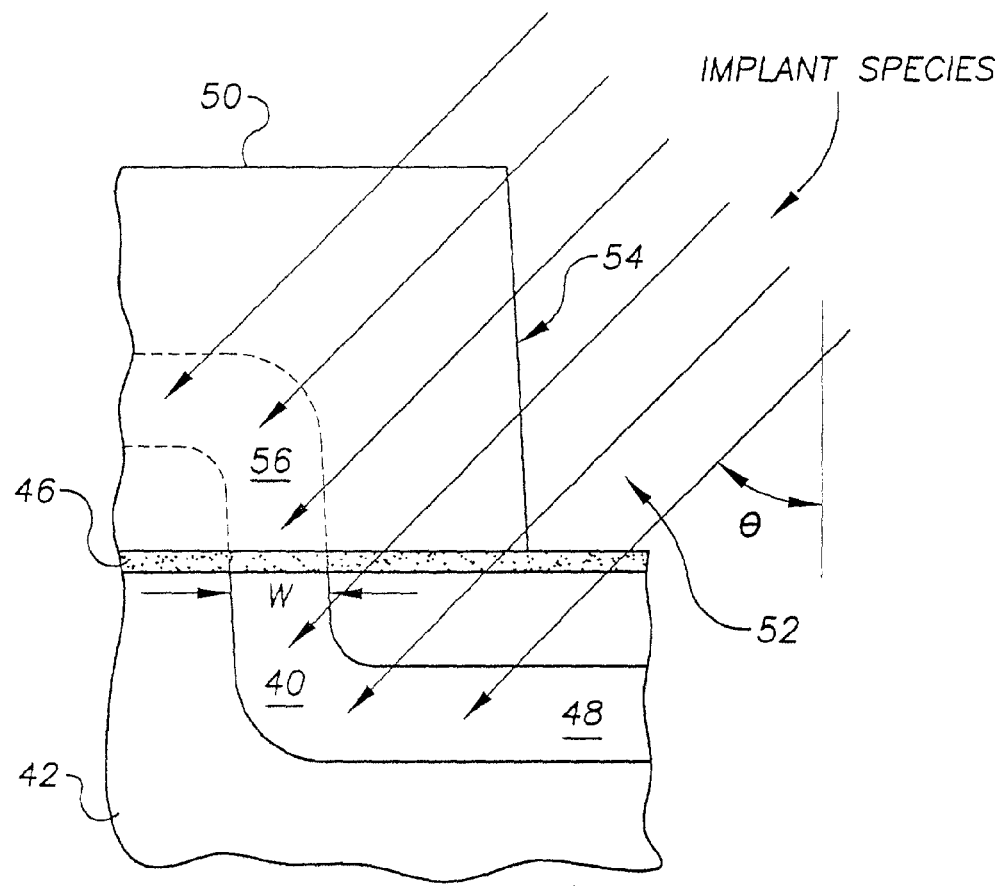
FIG. 5 is a schematic cross sectional view of a substrate and masking layer into which impurity ions are being implanted at an angle, in accordance with the invention, to produce a blooming barrier region of a width corresponding to the angle.

Referring to FIG. 5, this is accomplished in accordance with the invention by a compensating impurity ion implantation step in which the implant impurity species is directed at the substrate 42 at an angle, $\theta$, with respect to the normal to the substrate, i.e. in a non-vertical direction. The direction of the implantation thus makes an acute angle with the substrate. A masking layer 50 is provided on the substrate with an opening 52 over the desired location of the blooming drain. The masking layer composition and its impurity implantation stopping power, as well as the extent of the layer opening 52, and the profile 54 of the opening sidewalls can be considered in accordance with the invention such that for an implant angle, implant dose, and implant energy, a very precise compensation doping distribution is produced in the substrate.

The arrowhead locations in FIG. 5 indicate the mean impurity ion depth of the implant distribution in a semiconductor substrate for the given implant angle and masking layer characteristics; here the masking layer is shown to also be a function of a dielectric layer 46 on the substrate surface. The vertical and lateral range of the implanted impurity distribution produces the blooming barrier region 40 as well as the lower photoelectron barrier region 48. The profile of the implanted distribution region 56 that curves up into the masking layer is also shown.

The ion implantation distribution of FIG. 5 makes clear that in accordance with the invention, the blooming barrier region doping profile is at least partially the result of implanted ions that have penetrated through the side wall of the masking layer 50. The characteristics of the masking layer therefore impact the profile. As a result, in accordance with the invention any one of a wide range of desired widths, W, for the blooming barrier region can be achieved by selecting a corresponding implant angle and by selecting implantation and masking layer characteristics for the selected implant angle.

Figure 6:
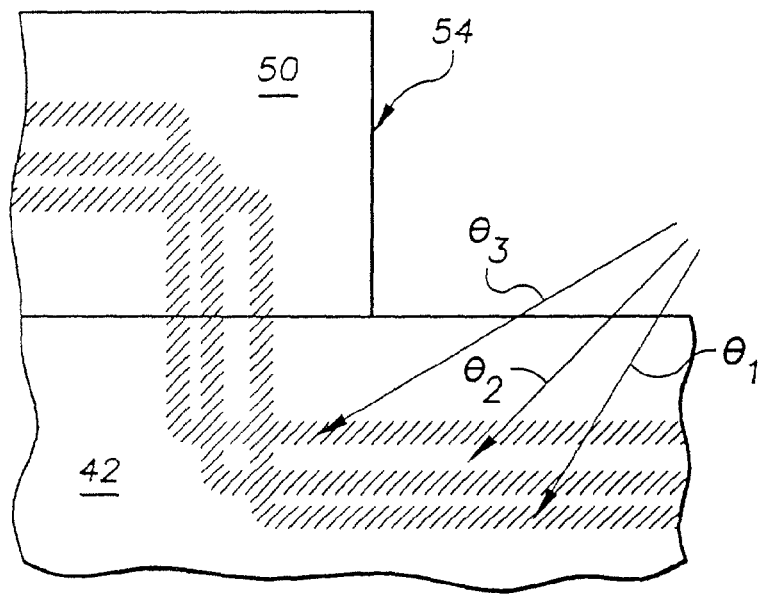
FIG. 6 is a schematic cross sectional view depicting the mean impurity profiles in a substrate and masking layer that result from three impurity ion implantations of differing angles in accordance with the invention.

Considering first the effect of the implant angle, referring to FIG. 6 there is shown for a given masking layer 50 having a given wall profile 54 the mean impurity ion depth profile for each of three implant angles, $\theta_1$, $\theta_2$, $\theta_3$ of increasing angle with the normal to the substrate. The stopping power of the masking layer 50 to the impurity ion implantation is here given to be the same as that of the substrate 42. The implant energy is assumed to be the same for all three implant angles. The arrowhead location for each of the indicated implant angles points to the corresponding mean ion depth profile in the substrate resulting from that implantation angle. It is shown that for the given process conditions, as the angle of the implantation with respect to the normal is increased, the lateral profile extent of the implantation distribution is correspondingly increased. In addition, as the angle of the implantation with respect to the normal is increased, the vertical profile extent of the implantation distribution is correspondingly decreased.

Figure 7:
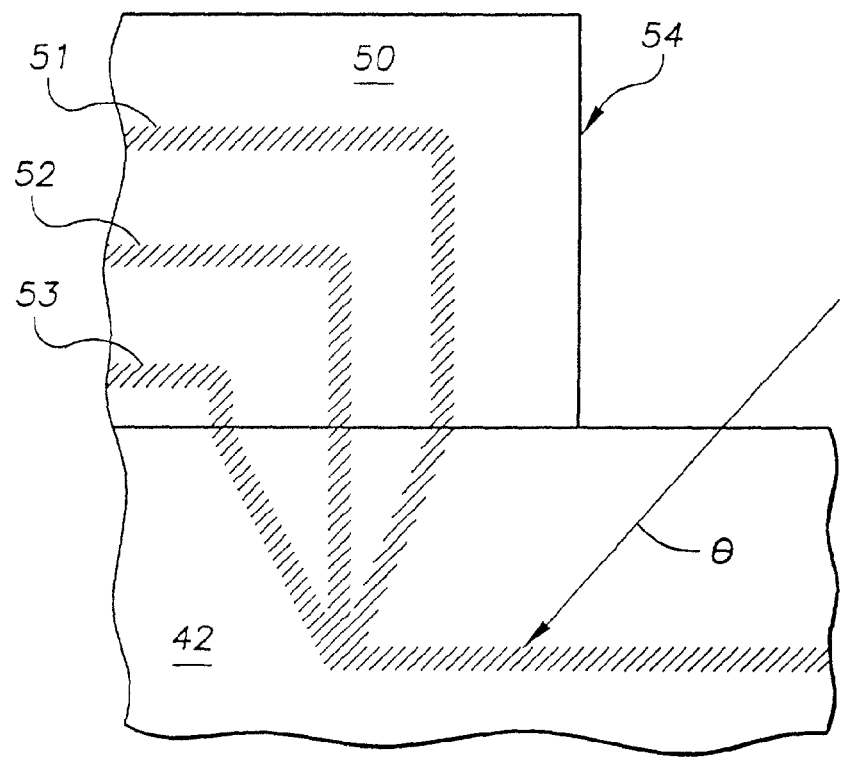
FIG. 7 is a schematic cross sectional view depicting the mean impurity profiles in a substrate and masking layer that result from angled impurity implantation through three different masking layer stopping powers in accordance with the invention.

Considering next the impact of masking layer stopping power on the implantation profile, there is shown in FIG. 7 the mean ion depth profile in a substrate produced by a given implantation angle, θ, of about 45° and vertical masking layer wall profile 54 for three masking layer stopping powers. Although the analysis of stopping power is complex, the penetration range of an impinging impurity ion is generally lower for materials having a high mass density and high atomic number.

In FIG. 7 there is shown a first implantation profile 51 for a scenario in which the mask stopping power is greater than that of the substrate 42; an implantation profile 52 for a scenario in which the stopping power of the masking layer is the same as that of the substrate; and an implantation profile 53 for a scenario in which the stopping power of the masking layer is less than that of the substrate. That portion of the implantation profile produced by ions that do not traverse the masking layer is seen to not be effected by changes in stopping power. Both the vertical and the lateral aspects of the implantation profile in the substrate 42 are highly impacted by changes in the stopping power, however. With a masking layer and substrate of substantially the same stopping power, a purely vertical profile at the lateral edge of the implanted region is achieved. The lateral extent of the implanted region is increased with a masking layer of lower stopping power, while the lateral extent of the implanted region is decreased with a masking layer of higher stopping power.

Figure 8A:
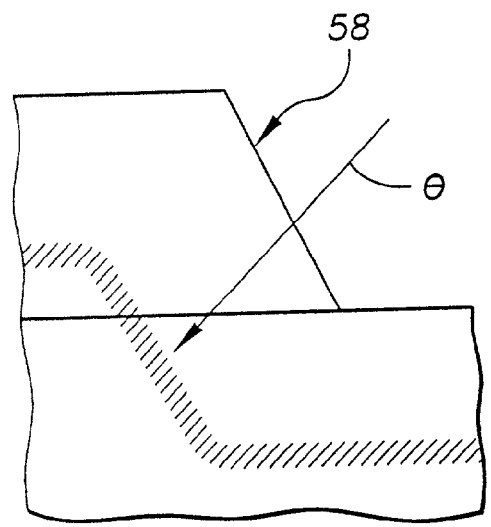
FIGS. 8A–8C are schematic cross sectional views depicting the mean impurity profiles in a substrate and masking layer that result from angled impurity ion implantation through three different masking layer opening sidewall profiles in accordance with the invention.
Figure 8B:
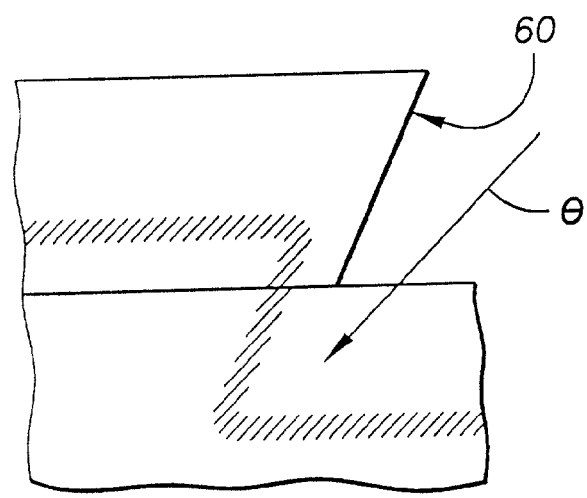
Figure 8C:
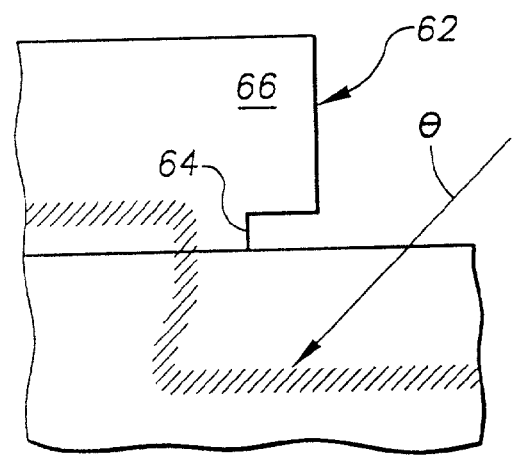

Now considering the effect on implantation profile of masking layer sidewall profile, there is shown in FIGS. 8A–8C the mean implantation profile for three distinct masking sidewall geometries 58, 60, 62, respectively, all for the same implantation angle, θ, of about 45°. The first wall geometry 58 slopes outward; the second wall geometry 60 slopes inward, and the third wall geometry 62 includes an undercut portion 64 below an overhang portion 64. The masking layer stopping power is assumed in each case to be the same as that of the substrate, and the implantation energy is assumed to the be same for all cases. It is seen in all three cases of FIGS. 8A, 8B, and 8C that the implantation profile generally follows the masking layer wall profile; specifically, the lateral extent of each implanted region is a function of depth that corresponds to the sidewall profile of the masking layer. The overhang masking layer profile of FIG. 8C is found to produce an implantation profile in which the lateral extent of implanted region forms a lower ridge extension corresponding to the undercut portion 64 of the mask. These three examples demonstrate the broad range of control in implantation profile in three dimensions that can be achieved with the masking layer wall geometry.

Figure 9A:
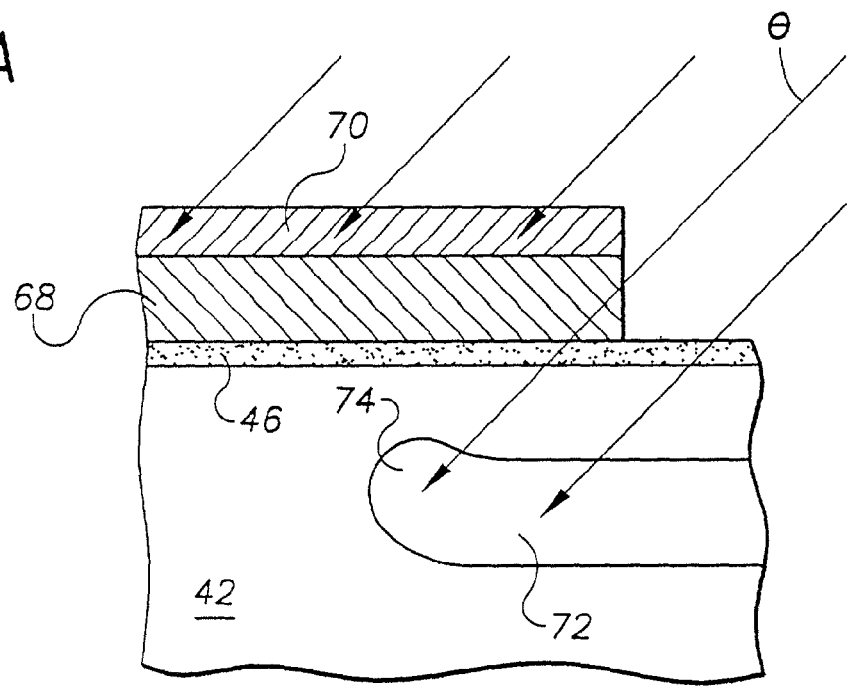
FIGS. 9A–9B are schematic cross sectional views depicting the mean impurity profiles in a substrate and multiple masking layer configuration that result from angled impurity ion implantation through two different masking layer combinations of thickness, stopping power, and geometry in accordance with the invention.

It is contemplated in accordance with the invention to further tailor the stopping power of the masking layer by, e.g., employing two or more different masking layer materials. There is shown in FIG. 9A a configuration in which a thin dielectric layer 46 is provided on a substrate 42, with a first masking layer 68 of a relatively low stopping power, and a second masking layer 70, of a relatively higher stopping power, overlaying the dielectric layer. The composition of the upper layer 70 is assumed to be of sufficient stopping power that the implant is fully blocked by a relatively thin layer of this material. A vertical masking layer sidewall is assumed. Implantation of the substrate at an angle, θ, through the multi-layer mask is found to produce an implantation profile that is a function of the masking layer thicknesses.

Taking into account the dielectric layer 46, if the lower masking layer 68 is relatively thin, then as shown in FIG. 9A, the implant region 72 is a lateral buried region with no vertical region rising to the substrate surface; the upper masking layer 70 completely stops implantation in that substrate region. The traversal of the implanted ions at an angle through only the lower masking layer 68 determines the implantation profile at its lateral edges. Specifically, the extent of a cusp region 74 of the implant is set by the properties of the lower masking layer 68. This cusp area can be enlarged or reduced by varying the thickness of the lower mask layer 68, and can be eliminated by removing the lower masking layer altogether.

Figure 9B:
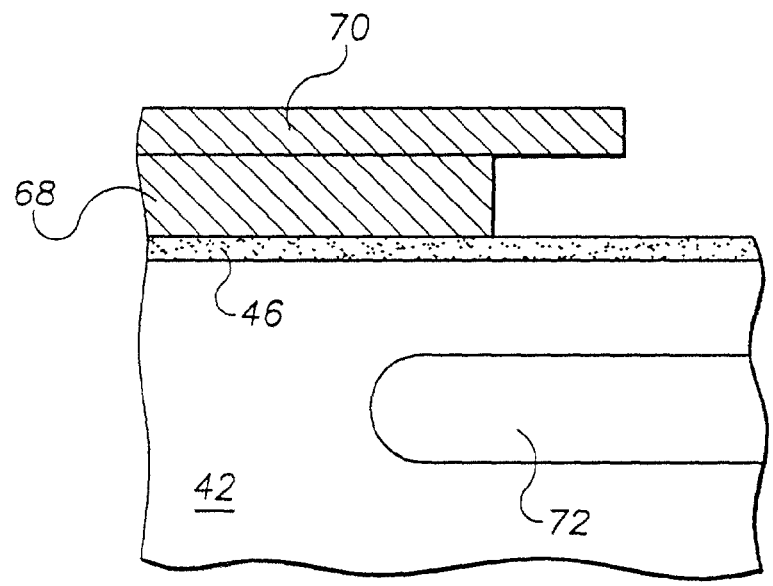

If it is desired to control the lateral extent of the implantation region to enable the specification of an arbitrary distance under the masking layer, then in accordance with the invention the geometry of the masking layers is selected based on the implantation angle. For example, as shown in FIG. 9B, a mask configuration employing an undercut lower masking layer 68 that produces an overhang in the upper masking layer 70 will result in a buried implantation profile 72 the lateral edges of which are free from cusp regions.

Figure 10:
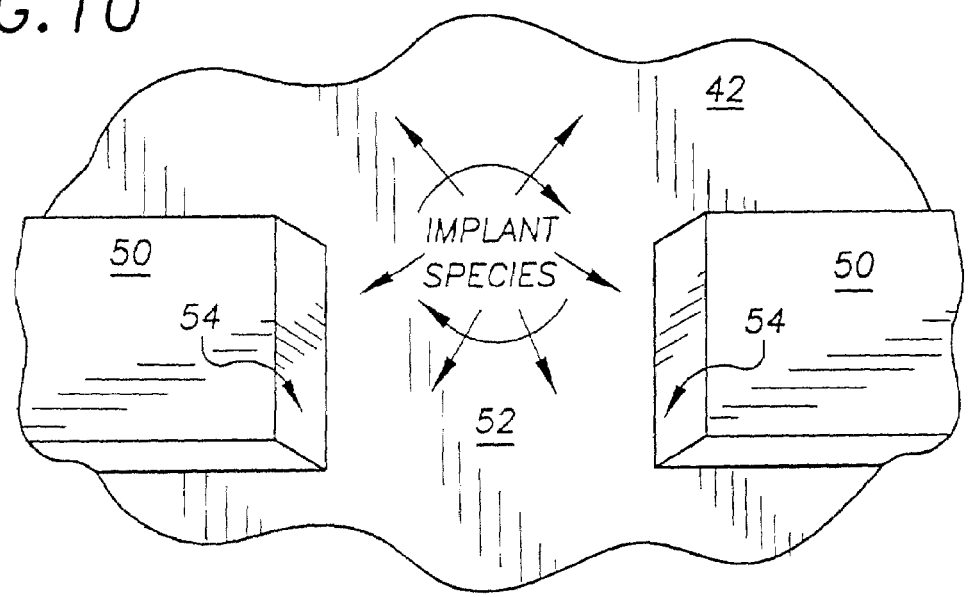
FIG. 10 is a schematic view of an angled and rotated impurity ion implantation process carried out on a masking layer having an opening, in accordance with the invention.

A further implantation process parameter to be optionally controlled in accordance with the invention is rotation of the angled ion trajectory through a range of horizontal angles. This is schematically shown in FIG. 10, depicting a configuration of a masking layer 50 in which an opening 52 has been formed over a substrate 42. A desired sidewall profile 54 has been imposed on the geometry of the masking layer opening.

The trajectory of the ion implantation is specified by an angle θ, as described above, made by the ions with respect to the normal to the substrate, this is an acute angle with the substrate. This angled trajectory is then specified to be swept through some angular arc in the horizontal plane, e.g., through a complete 360° rotation, as shown, or some angular arc forming less than a complete rotation. The impurity distribution profile in the substrate that results in this scenario is a function of the masking layer characteristics, as described above, in corresponding substrate regions, and is a function of only the substrate characteristics in the region of the masking layer opening.

This rotated and angled impurity ion implantation process provides additional parameters for fine tuning an implantation profile, and enables differing profiles at different substrate locations, depending on the proximity of each location to a masking layer. For example, for some masking layer configurations, the substrate area near the center of the opening 52 in the masking layer 50 receives a high implantation dose, relative to other substrate locations, if that substrate location is exposed to the ion trajectory at all rotational angles. Correspondingly, rotation can be employed to ensure that sufficient dopant is implanted in a configuration in which some portions of the substrate are entirely masked by the masking layer at the one or more implant angles. As a result, the rotated, angled implantation of the invention enables a high degree of flexibility in device layout, e.g., enabling the fabrication of a blooming control structure oriented in any desirable direction for defining channels of a CCD imager.

Figure 11A:
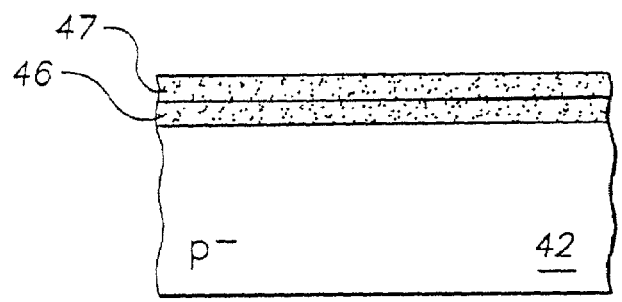
FIGS. 11A–11E are schematic cross sectional views of an angled impurity ion implantation process in accordance with the invention for producing a blooming control structure having a blooming barrier width set by a selected blooming barrier impurity ion implantation angle, in accordance with the invention.

Referring to FIG. 11A, there is depicted a first process step in an example impurity ion implantation process provided by the invention for producing a high-precision blooming control structure. This example process is based on formation specifically of a CCD imager, for purposes of clarity, but as can be readily understood it can be adapted for a wide range of image sensing configurations. In an example process for producing an n-type buried channel CCD configuration, a lightly doped p-type silicon wafer 42 is provided, at a doping level that is preferably less than about $10^{14}$–$10^{15}$ cm$^{-3}$.

As shown in FIG. 11A, gate insulating layers 46, 47 are provided on the substrate. In one example the lower insulating layer is formed by thermal oxidation of the substrate to produce about a 60 nm-thick silicon dioxide layer, using a conventional thermal oxidation process. A conventional low pressure chemical vapor deposition step is then carried out to produce about a 40 nm-thick layer of silicon nitride 47 on the oxide layer. The quality and thickness of these insulating layers are specified, as is conventional, based on the CCD gating characteristics, and are not critical for the blooming control structure of the invention. For example, as can be recognized, the silicon nitride insulating layer is not required.

Figure 11B:
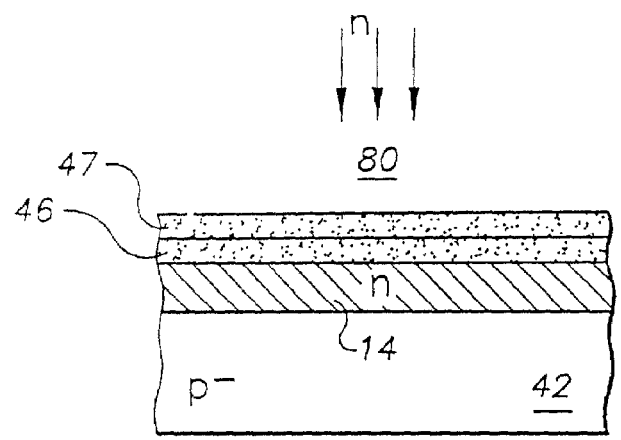

As shown in FIG. 11B, a blanket, i.e., unmasked, vertical n-type ion implantation step 80 is then carried out to form a moderately doped n-type buried channel region 14 in the substrate 42. In one example, phosphorus is implanted at a dose of between about $1 \times 10^{12}$ cm$^{-2}$ and about $2 \times 10$ cm$^{-2}$, at an energy of between about 50 keV and about 200 keV; in a specific example, a dose of about $1.25 \times 10^{12}$ cm$^{-2}$ is implanted at an energy of about 200 keV. The buried channel depth is set at, e.g., about 0.2 µm–0.3 µm.

It is not required by the process of the invention that the oxide and nitride insulating layers 46, 47 be formed on the substrate prior to the buried channel implant and proceeding steps to form the blooming control structure. However, it is preferable in most applications to first form an oxide insulating layer because thermal oxidation subsequent to the implantation steps would consume a portion of the implanted substrate and the implanted dopants would preferentially segregate, toward the oxide in the case of boron and deeper in the silicon, in the case of phosphorus. The resulting implantation profile in the substrate would be difficult to reliably predict and would be difficult to control due to process variations in thermal growth temperatures and other conditions.

Figure 11C:
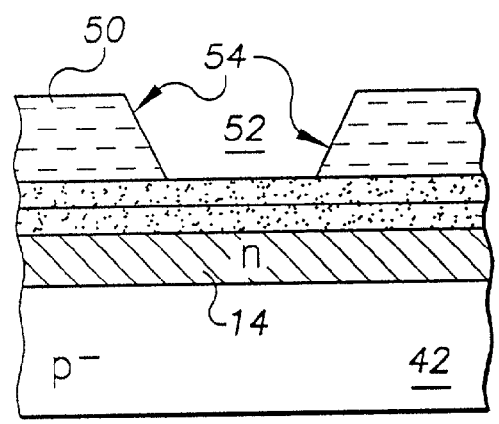

Referring to FIG. 11C, in a next process step a masking layer 50 is formed on the substrate and an opening 52 having a desired sidewall profile 54 is produced in the layer. The masking layer can consist of photoresist or other polymer, an insulating material such as oxide or nitride, a conducting material such as polysilicon, or other suitable material that can be patterned with an opening having a desired sidewall profile. Based on the previous discussion it is to be recognized that a multi-layer and multi-composition structure can be provided as the masking layer. For many applications photoresist can be a preferable masking material because it can be patterned in one step. In contrast, a masking layer of, e.g., oxide would require the use of an upper photoresist layer that is photolithographically patterned and that acts as a mask for subsequent patterning of the desired opening in the oxide layer. This multi-step process is less efficient but it is recognized in accordance with the invention that an appropriate mask material be selected and processed, as needed, to produce a desired mask opening sidewall profile.

In one example process, a coating of SPR-518 photoresist from Shipley Corp., Marlborough, Mass., is spun on the substrate to a thickness of about 1.8 µm in the conventional manner. The photoresist is then photolithographically exposed and developed, in the conventional manner, to produce an opening 52 that corresponds to the desired width of the blooming drain. Referring to FIGS. 1B and 10, this opening is thus a longitudinal column that extends beyond the length specified for the buried channels. In one example, the lateral width of this opening, i.e., the lateral blooming drain width, is about 2 µm at the substrate. Using conventional photolithography and development processes, the sidewalls of the opening form an angle of about 76° with the substrate surface.

As can be understood from the discussion above, various processes can be employed to produce any desired sidewall angle or geometry, such as those in FIGS. 8A–8C and 9A–9B. Various conventional plasma deposition and etch processes, as well as conventional wet etch and plating processes, can be employed to produce a desired masking layer sidewall profile. In addition, multiple masking layers of varying composition can be produced to tailor the stopping power of the masking layers in the manner described above.

Figure 11D:
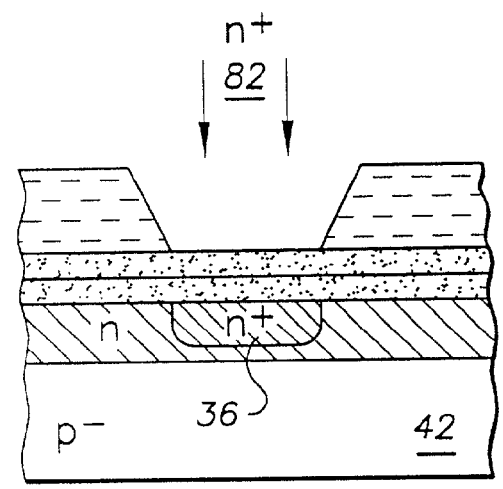

Referring to FIG. 11D, the blooming drain is then formed by a substantially vertical ion implantation 82 of, e.g., arsenic, only through the opening in the masking layer; i.e., the masking layer thickness and stopping power are selected such that the implantation does not reach those areas of the substrate masked by the layer. This can be assumed for most conventional photoresist compositions and typical thicknesses. The blooming drain ion implantation 82 is preferably carried out at or close to the vertical, i.e., not at an angle, in order to confine the lateral spread of the heavy implantation dopant at the edges of the masking layer opening, to avoid heavy doping of the channel regions at which the blooming barriers are to be formed.

As explained, the blooming drain is to be heavily doped such that it is of low resistivity to a blooming current flow. The implant energy is selected to implant sufficient impurity through the insulating layers on the substrate that are exposed in the masking layer opening, if such layers are included. Although the drain implant depth is shown somewhat arbitrarily in FIG. 11D, this depth is preferably set based on the buried channel and photoelectron barrier characteristics. Of primary concern, the drain depth is preferably sufficiently shallow so that under normal bias conditions the drain will not deplete the heavily-doped p-type photoelectron barrier beneath it. Thus, a relatively shallow drain can be preferred to provide the largest latitude in selecting the implant energy and dose of the photoelectron barrier. In one example, implantation of arsenic at a dose of about $5 \times 10^{14}$ cm$^{-2}$ and at an energy of about 200 keV is carried out. Arsenic has the desirable characteristic of a relatively low thermal diffusion coefficient, and therefore its implant profile is relatively easy to predict for subsequent thermal processing. Phosphorus can also be employed, however, provided that allowance is made for its higher diffusion rate.

Figure 11E:
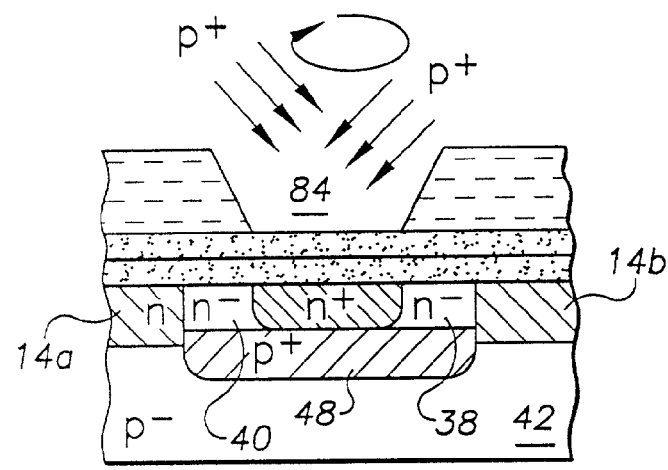

Referring to FIG. 11E, the photoelectron barrier region 48 and the blooming barrier regions 38, 40, are then formed, preferably in accordance with the invention by a single angled ion implantation impurity compensation step 84. With this compensation implantation complete, the blooming barrier regions laterally separate the blooming drain from distinct buried channels 14a, 14b. In one example angled ion implantation process, the substrate is secured in a conventional ion implanter in a configuration that defines between the substrate and the ion gun a selected implantation trajectory angle, θ, as defined above, e.g., an angle of about 45°. The impurity ion implantation is then carried out, and if desired, the substrate is rotated, about the axis normal to the substrate, as the implantation proceeds. The implantation dose and rotation rate are preferably selected to ensure that an equal net implantation dose is delivered at each of the angles of the rotation.

The ion implantation dose of this compensation implantation step is preferably specified to compensate the n-type channel to form lightly doped n-type or p-type blooming barrier regions along the channel. In one example, an implant dose of boron of between about $3\times10^{12}$ cm$^{-2}$ and about $7\times10^{12}$ cm$^{-2}$ at an energy of about 300 keV is specified to produce lightly doped n-type blooming barrier regions. The ion implantation dose of this compensation step also is preferably specified to produce the heavily-doped photoelectron barrier, if such is to be produced by the same step. As explained above, the photoelectron barrier doping must be high enough to deflect charge away from the blooming drain and correspondingly must be high enough that the region is not completely depleted of charge by electric fields in the blooming drain region. A photoelectron potential barrier height that is at least about six times the average electronic charge thermal energy is typically sufficient to deflect virtually all electrons from the blooming drain region. Given a p-type substrate dopant level of about $10^{14}$ cm$^{-3}$, the required doping of the p-type photoelectron barrier is thus of a wide latitude. This latitude is what enables the ability to specify a single boron compensation implant that successfully forms both the precisely compensated blooming barrier regions and the heavily-doped photoelectron barrier region.

The lateral and vertical extent of the blooming barrier regions as well as the photoelectron barrier region are determined by the angle of this p-type compensation implantation, the stopping power of the masking layer, here photoresist, the profile of the masking layer sidewalls, the thickness of the masking layer, the width of the opening in the masking layer, and the extent of implantation rotation employed. In accordance with the invention, ranges of these parameters can be investigated by, e.g., computer simulation, to ascertain a set of process parameters that precisely produces desired blooming barrier and photoelectron barrier configurations. Simulation using, e.g., Athena, from Silvaco International, of Santa Clara, Calif. has been demonstrated to produce a simulated blooming control structure profile that predicts the characteristics of the fabricated structure with good precision. With such a simulation exercise, a specific masking layer material, thickness, sidewall profile, opening width, as well as ion implantation angle, dose, energy, and rotation increment are specified, in accordance with the invention, to produce the desired blooming barrier region doping profile, to produce the desired blooming barrier width as a function of the implant angle, and to produce the desired photoelectron barrier region doping profile.

Figure 12A:
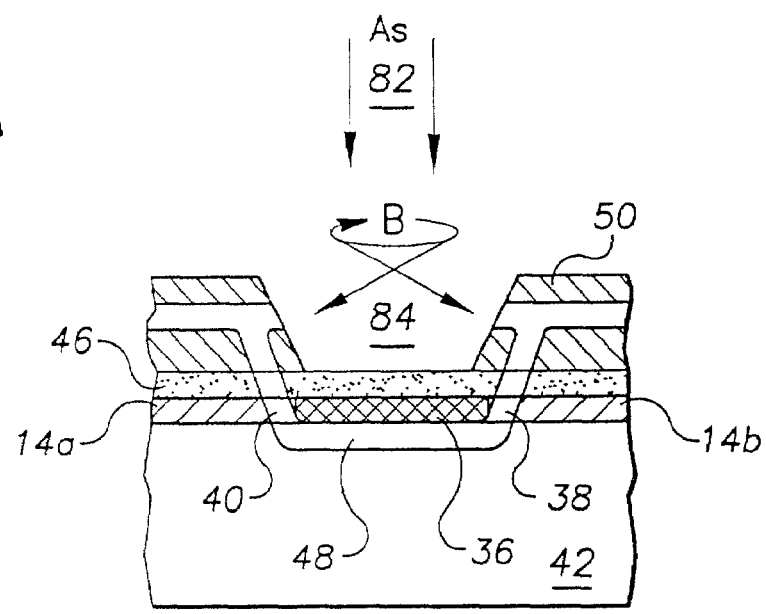
FIGS. 12A–12B are schematic cross sectional views summarizing optional one-step and two-step impurity ion implantation processes, respectively, that can be employed in the fabrication sequence of FIGS. 11A–11E, in accordance with the invention.

FIG. 12A depicts a schematic summary of the two-step impurity implantation process provided by the invention for precisely defining the entire blooming control structure. A vertical arsenic implant 82 forms the blooming drain, and an angled, rotational boron implant 84 forms the blooming barrier regions and the photoelectron barrier region. This figure explicitly indicates the impurity profile of the implants in both the substrate and the masking layer, and emphasizes that the precision of the compensating boron implant is crucial for setting the characteristics of the blooming barrier regions 38, 40.

Figure 12B:
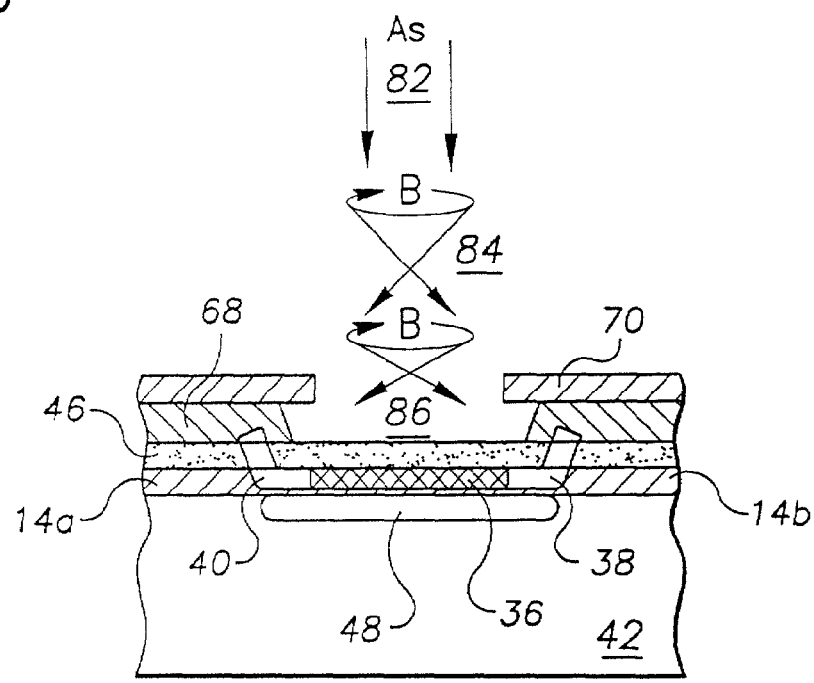

It is contemplated in accordance with the invention that for some applications it may be desirable to decouple the blooming barrier formation from the photoelectron barrier formation so that the impurity doping of these regions can be independently produced. Referring to FIG. 12B, this can be accomplished with multiple angled implantation steps and employing multiple tailored masking layers. For example, two masking layers 68, 70 can be employed, as shown and described in connection with FIG. 9B, the lower layer 68 undercut to form an overhanging upper layer 70. The upper layer is assumed to be of a higher stopping power than the lower layer.

In an example decoupled implantation scenario, a vertical arsenic implantation 82 is first carried out in the manner described above. Then a first angled, rotational boron implant 84 is carried out at a dose and energy level that produces only the photoelectron barrier region 48. As indicated in the figure, the two-layer masking configuration blocks the boron implant from the channel regions designated for the blooming barriers. A second angled, rotational implant 86 is then carried out at a shallow angle to compensate the channel and produce the desired blooming barrier regions 38, 40 without adding additional p-type dopant to the photoelectron barrier region.

It is recognized that this shallow implant adds additional p-type dopant to the blooming drain, but due to the very high n-type doping of the drain region, this is typically of no consequence. This decoupled ion implantation process illustrates the breadth of process control and the precision of dopant distribution that can be produced by the angled ion implantation process provided by the invention.

Whatever implantation scenario is employed, once the photoelectron barrier and the blooming barrier regions are formed, the masking layer or layers can be removed and processing of the substrate carried out to complete the imager. In one example process, a polysilicon layer of about 200–400 nm in thickness is then deposited by conventional low pressure chemical vapor deposition techniques on the nitride and underlying oxide insulating layers on the substrate surface. The polysilicon and the nitride layers are then patterned using standard plasma etch techniques to expose areas of the underlying oxide layer. At this point, a conventional thermal annealing step, e.g., at a temperature of at least about 900° C. for about 30 minutes in an ambient of, e.g., $O_2$, $H_2O$, or $N_2$, is then carried out to activate the implanted dopants. Patterning of the polysilicon to form gate electrodes is then carried out to complete the imager. As can be recognized, a thermal activation step can alternatively be carried out at any suitable point in the process sequence, taking into account the required profile of any other dopant regions in the device.

As can be recognized, a wide range of structure variations can be incorporated into the blooming control structure fabrication, and such are contemplated by the invention. Additional implantation or other impurity doping steps can be carried out to adjust vertical and/or lateral profiles of conductivity type and levels through the structure. For example, it is commonly desirable in operation of a CCD imager that the electrical blooming barrier potential go to zero when the corresponding applied gate voltage is sufficiently negative. In other words, for an n-type channel device, it is desirable that holes be available at the substrate surface in the region of the lightly doped, e.g., n-type, blooming barrier. In the blooming control structure configurations described above in which a heavily-doped p-type photoelectron barrier is provided at a substrate depth beneath the blooming barriers, this can be accomplished with holes from the photoelectron barrier.

But for many cases it is preferable that a p-doped region be provided, e.g., in the blooming barrier regions, to provide a source of holes at the substrate surface. This can be accomplished by an additional ion implantation step of, e.g., boron. In one example process, a second mask is employed to define the p-type region to be implanted in each barrier region. Vertical and/or angled and rotation boron implantation is then carried out, in the manner of the implantation steps described above, to produce the p-type source of holes. As can be recognized, the p-type source of holes can be located elsewhere in the blooming control structure as appropriate. This additional step is not required but can be advantageous for some imager applications such as those tailored for low-light-level conditions.

Figure 13A:
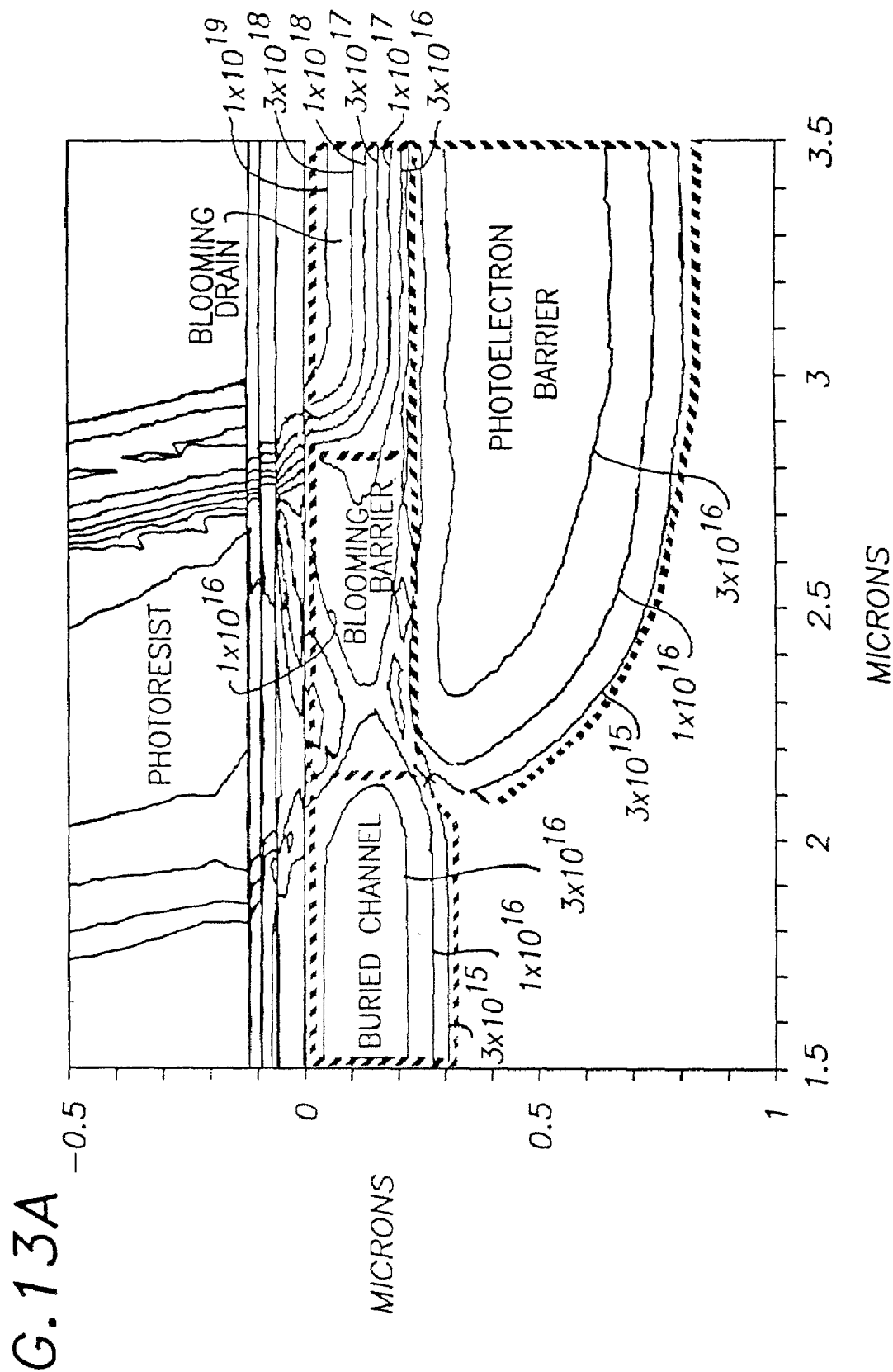
FIG. 13A is a simulation plot of dopant profiles in a silicon substrate in which a blooming control structure is fabricated in accordance with the process of FIG. 12A.
Figure 13B:
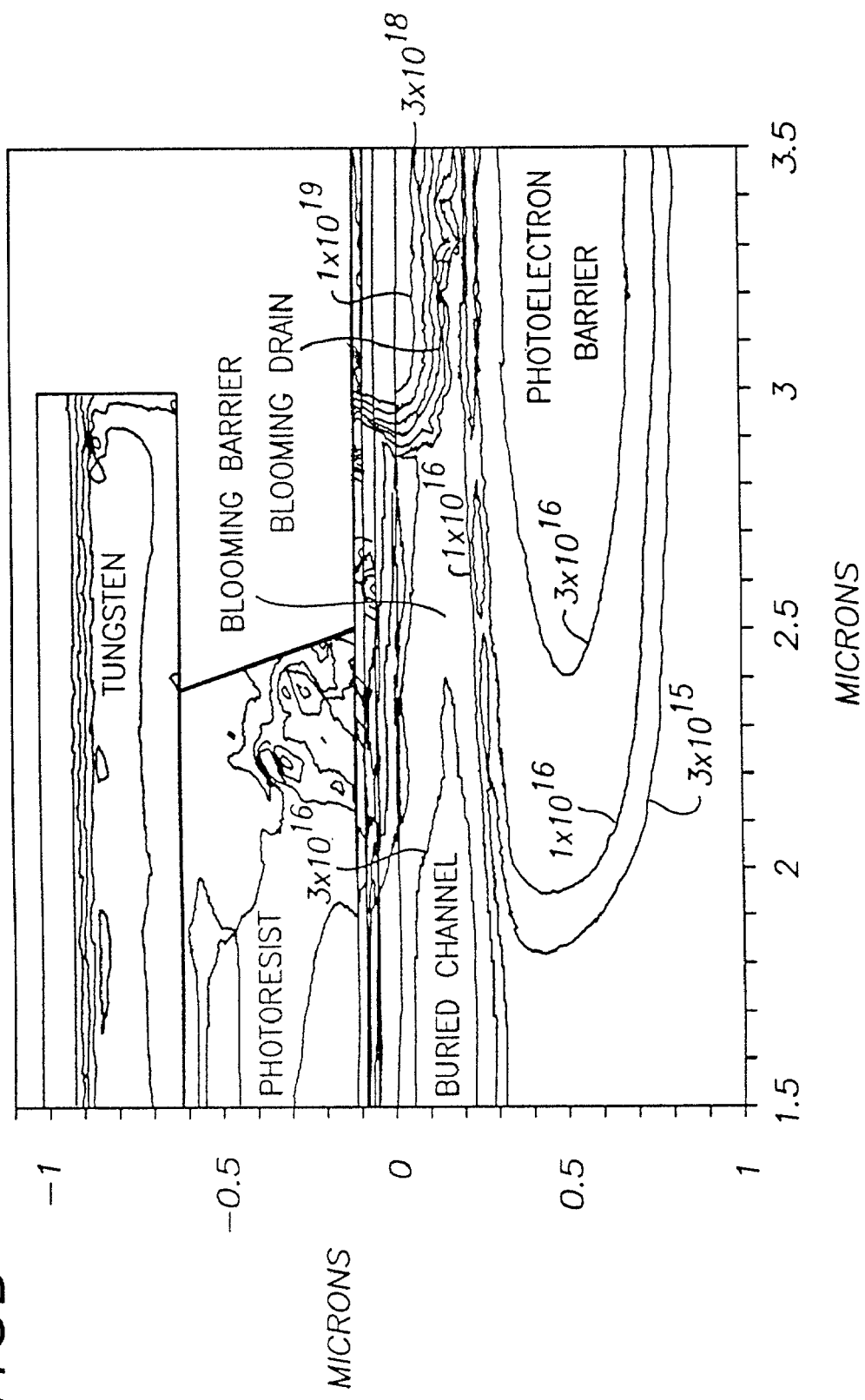
FIG. 13B is a simulation plot of impurity profiles in a silicon substrate in which a blooming control structure is fabricated in accordance with the process of FIG. 12B.

Referring to FIG. 13A there is shown an impurity profile simulation for the blooming control structure fabrication process of the invention in which one angled impurity implantation step is employed to produce both the blooming barrier regions and the photoelectron barrier region. This simulation assumes the use of a photoresist masking layer having a sidewall profile angle of about 76°. Note that the blooming drain, blooming barrier, and photoelectron barrier regions are all well-defined and of the specified doping concentrations. Referring to FIG. 13B there is shown a corresponding doping profile simulation for fabrication process of the invention in which a distinct angled implantation step is employed to form each of the blooming barrier and photoelectron barrier regions. The two-layer masking configuration of FIG. 9B and FIG. 12B is assumed here, wherein the blooming barrier regions are found to be shielded by the mask during the photoelectron barrier implantation step. As in the simulation of FIG. 13A, the blooming drain, blooming barrier, and photoelectron barrier regions are all found to be precisely formed by the process. It is seen that the cusp-like lateral edge of the photoelectron barrier produced by the single implantation step and shown in FIG. 13A is eliminated by the decoupled implantation steps, as illustrated by the profile in FIG. 13B.

Figure 14:
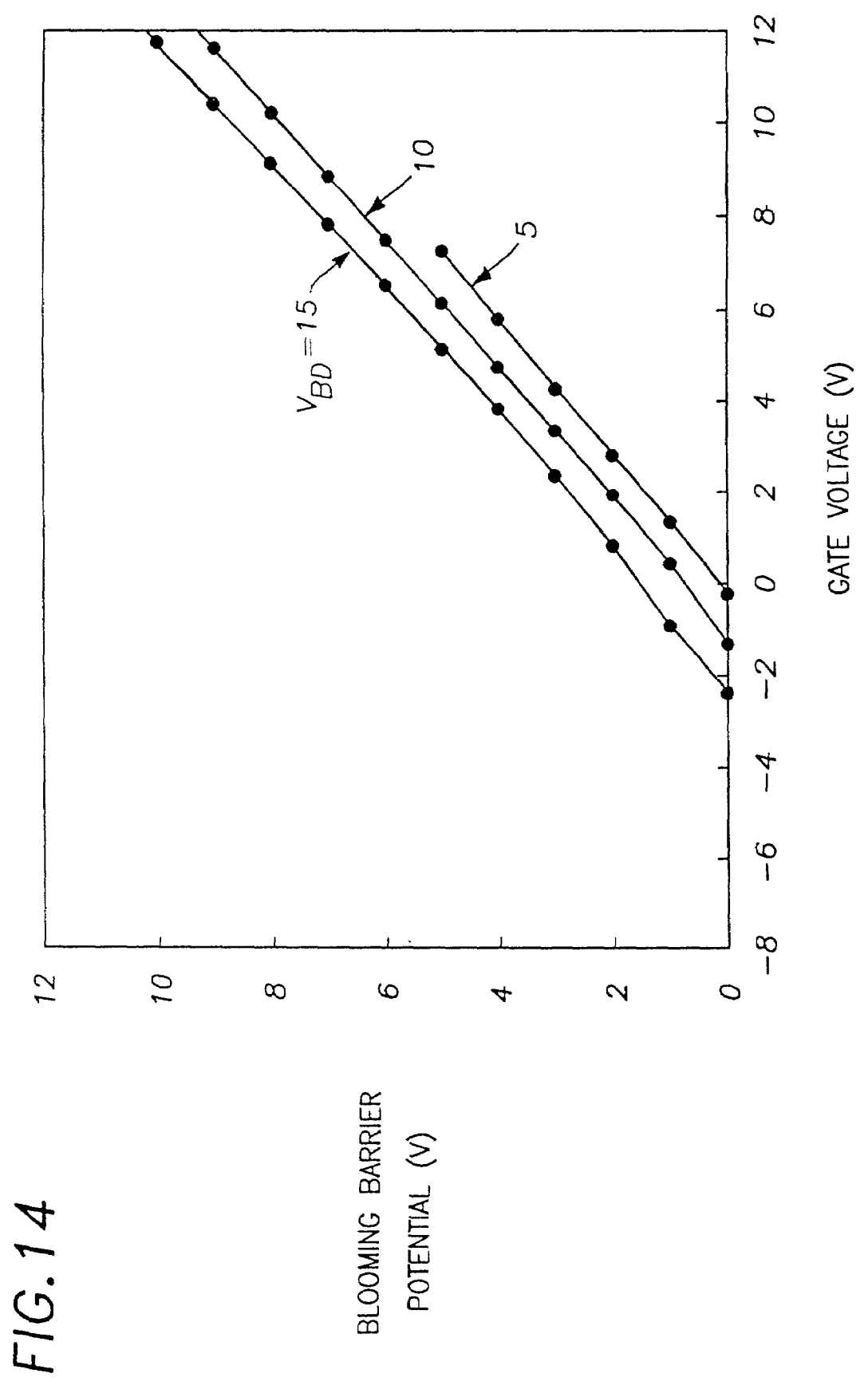

Referring to FIG. 14 there is shown an experimental plot of blooming barrier potential as a function of CCD pixel gate voltage for a blooming drain bias of 5 V, 10 V, and 15 V. The CCD imager from which the plot data was taken was fabricated in accordance with the single-step blooming and photoelectron barrier implantation process described in connection with FIG. 12A, resulting in a blooming barrier width of about 0.7 μm and a blooming barrier doping of about $1 \times 10^{16}$ cm$^{-3}$. As indicated in the plot, the blooming barrier potential increases as the applied bias to the blooming drain is increased. This exemplifies the short channel effect, and confirms that the blooming barrier potential can be adjusted by the blooming drain bias for a relatively narrow blooming barrier region produced in accordance with the invention.

Figure 15A:
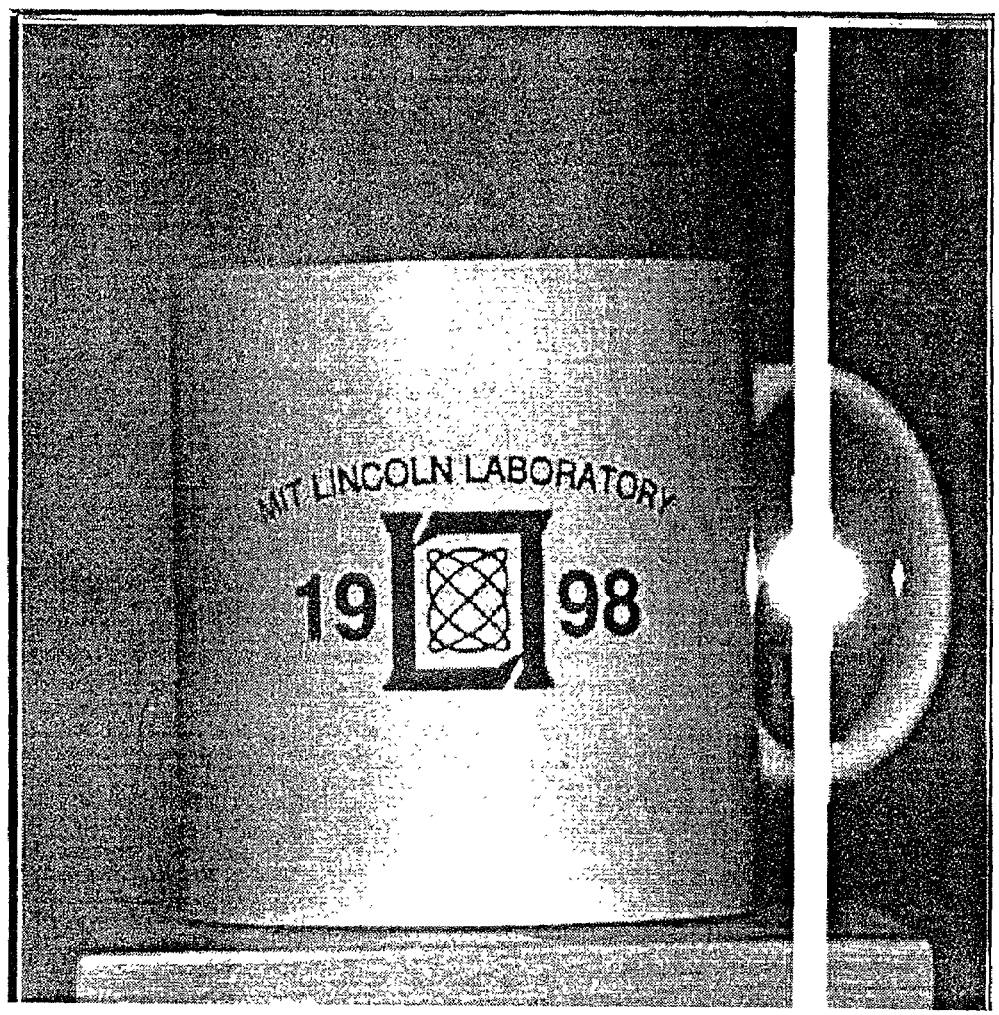
FIG. 15A is an image produced by a CCD imager without the functionality of a blooming control structure.
Figure 15B:
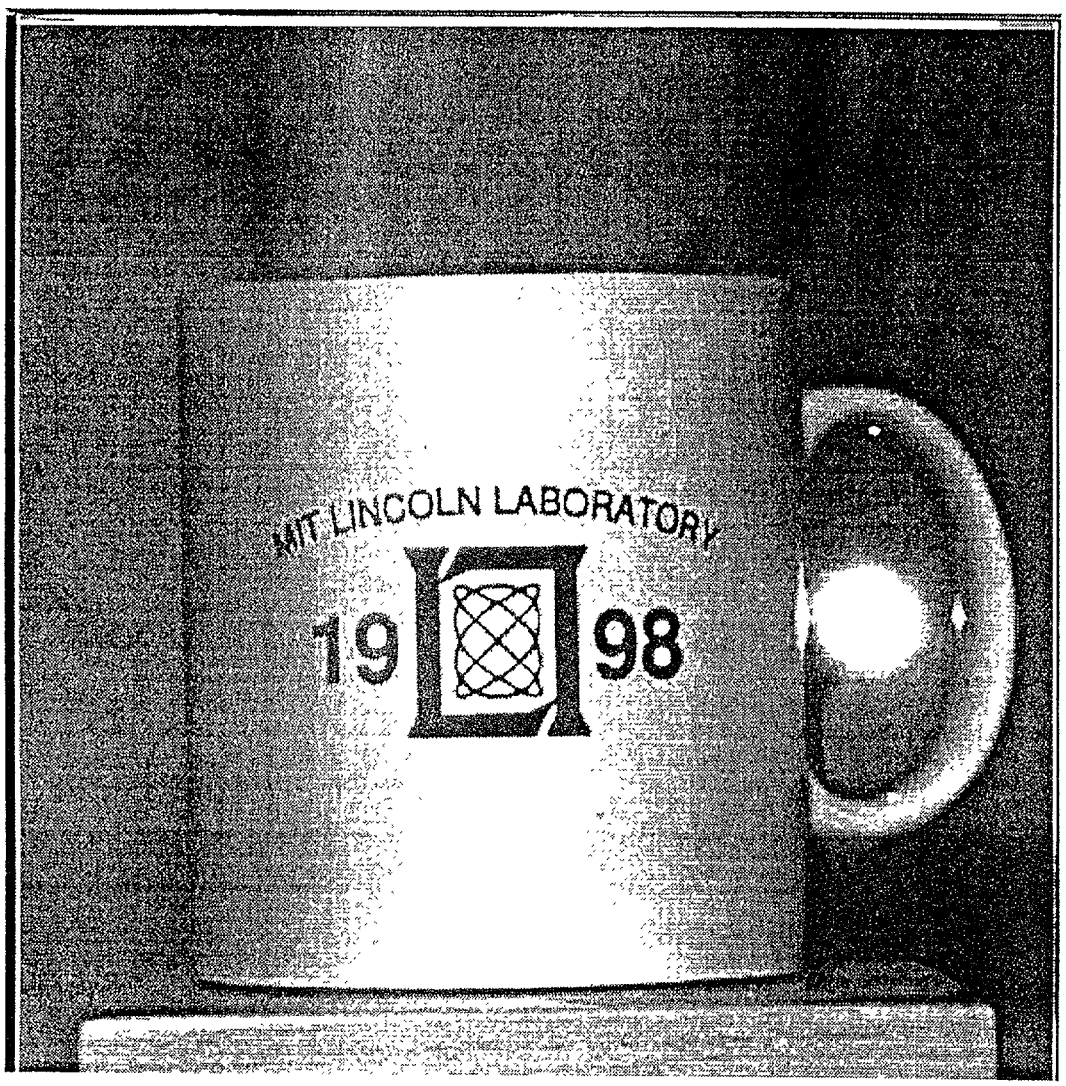
FIG. 15B is an image produced by a CCD imager including the functionality of the blooming control structure of the invention.

FIGS. 15A and 15B are images produced with a 512×512 frame-transfer CCD imager in which the blooming control structure of the invention was implemented, as disabled and as enabled, respectively. The CCD imager was fabricated as an n-type buried channel array of 15 μm-wide pixels and including a blooming control structure of the dimensions given above for the measurements of FIG. 14. The scene to be imaged consisted of a mug in which a bright LED was provided in the mug's handle opening. The LED produced a photoelectron count of about 1000× the charge capacity of a pixel in the imager. With the clock levels and blooming drain bias set to disable the blooming control operation, the image of FIG. 15A was produced. It is clearly evident in this image that excess charge flowed from the pixel at the site of the LED into adjacent pixels within the same channel column, to the point of filling the entire column. With the blooming control function enabled, the image of FIG. 15B was produced; here the pixel at the site of the LED is saturated, but no blooming of the excess charge has occurred. This indicates that for even very high-intensity scene illumination levels, the blooming control structure of the invention is successful.

A wide range of variations in process sequence and resulting structure are contemplated by the invention. As explained above, multiple angled implants can be carried out, each at a distinct angle. Rotation during any of the angled implants is not required. Alternatively, a number of selected rotational angles can be selected for a sequence of implants, each perhaps at a distinct angle with the vertical; and of course, rotation can be entirely eliminated. Considering a sequence involving no rotation, a first implant at a rightward angle and a second implant at a leftward angle can be employed to form the opposing blooming barrier regions flanking the blooming drain. Any number of implants, each at a distinct angle, and each employing a distinct rotational path or angle, can accordingly be employed to tailor the doping distribution of various substrate regions.

As can be recognized, there is no a priori restriction on the conductivity type or selected impurity of a given conductivity for the implantation steps. The substrate in which an imager is to be fabricated can be either n-type or p-type, with the imager and blooming control structure regions specified in accordance with the substrate selection. For example, in the fabrication process of FIGS. 11 and 12 above, the substrate can be n-type, with the buried channels and blooming drain then being p-type, the photogenerated charge barrier being strongly n-type, and the blooming barrier regions being n-type or p-type as desired to produce a corresponding potential barrier.

The masking layer can include an opening like that described above for forming a blooming drain, and can include multiple openings, each of differing geometry. In general the masking layer can provide a single sidewall or multiple sidewalls, which need not specifically define an opening, instead, e.g., defining an edge of the layer. The masking layer can be employed to define a mesa, rather than an opening, through and/or around which an angled implantation is to be carried out. In this case, the profile of the mesa sidewalls is manipulated in accordance with the techniques described above to produce a desired dopant distribution profile in the substrate.

The blooming control structure provided by the invention is not limited to buried channel CCD imagers; such can also be implemented with surface channel CCD imagers. The blooming control structure is further not limited to CCD imagers, and in general not limited to imagers which are backside-illuminated. CMOS, APS, and other image sensors, whether illuminated from the front or the back, and indeed any illumination sensor for which blooming control is required, can be addressed by the blooming control structure of the invention. For example, in a CMOS imager structure, blooming control of a MOS charge collection region or a photodiode region can be implemented with the provision of blooming drain and blooming barrier regions in a manner like that described above. A photogenerated charge barrier region such as a photoelectron barrier region can also be preferably implemented for backside-illuminated CMOS imagers.

The angled implantation processes provided by the invention are not limited to fabrication of blooming control structures. A wide range of semiconductor devices for which it is required to provide regions of impurity doping in a substrate can be advantageously produced by the process of the invention. MOS transistor structures, including, e.g., double-diffused MOS structures; bipolar transistor structures, particularly buried layer regions; resistor, capacitor, and other passive electronic structures; and other integrated circuit structures and devices can be fabricated by the impurity ion implantation angle and rotation processes of the invention.

For example, in fabrication of a MOS transistor structure, the edges of the transistor channel just under the MOS gate can be precisely tailored by one or a sequence of angled dopant implantation steps in which the gate is employed as a masking mesa. In accordance with the invention, the ion stopping power and the sidewall profile of the gate are both considered in selecting an implantation angle that results in a desired three-dimensional doping profile of the channel region being implanted. It is the tailoring of these multiple masking parameters in concert with selection of angle and optionally, rotation, of impurity implantation that enables a wide range of impurity region profiles and enables fine tuning of critical dopant regions such as a MOS transistor channel.

This discussion highlights the precision and flexibility in fabrication of semiconductor doping profiles that are enabled by the angled implantation processes of the invention. The invention provides a large number of process parameters that can be selected to operate in concert to fine tune device characteristics that are determined by the doping profile. This flexibility enables the fabrication of devices in a wide range of operating regimes. For example, a blooming control structure that is provided in accordance with the invention can be fabricated with a high degree of precision and with adjustability in its operational blooming barrier potential. It is recognized, of course, that those skilled in the art may make various modifications and additions to the blooming control structure and angled implantation embodiments described above without departing from the spirit and scope of the present contribution to the art. Accordingly, it is to be understood that the protection sought to be afforded hereby should be deemed to extend to the subject matter of the claims and all equivalents thereof fairly within the scope of the invention.

We claim:

1. A method of fabricating an imaging device blooming control structure comprising:
    providing a semiconductor substrate in which is configured a photogenerated electrical charge collection region;
    forming a masking layer on the substrate;
    providing an opening in the masking layer at a substrate location selected for a blooming drain;
    forming a blooming drain by implanting an impurity into the substrate at the location of the masking layer opening; and
    forming a blooming barrier region laterally adjacent to the blooming drain by implanting an impurity into the substrate at a first acute angle with the substrate to produce a lateral blooming barrier region width that corresponds to the first acute implantation angle.

2. The method of claim 1 wherein the masking layer comprises photoresist.

3. The method of claim 1 wherein the step of providing an opening in the masking layer comprises forming in the masking layer an opening having sidewalls characterized by a non-vertical profile.

4. The method of claim 1 wherein the step of forming a masking layer comprises forming at least two stacked masking layers each characterized by a distinct impurity implantation stopping power.

5. The method of claim 4 wherein the step of providing an opening in the masking layer comprises forming in each masking layer an opening having sidewalls of a distinct, non-vertical profile.

6. The method of claim 4 wherein the step of providing an opening in the masking layer comprises forming in each masking layer an opening of a distinct size.

7. The method of claim 1 wherein the semiconductor substrate is a first conductivity type and the charge collection region is of a second conductivity type, and wherein the impurity implanted into the substrate to form a blooming drain region is of the second conductivity type.

8. The method of claim 7 wherein the impurity implanted into the substrate to form a blooming barrier region is of the second conductivity type.

9. The method of claim 1 wherein the step of forming a blooming drain comprises substantially vertically implanting an impurity through the masking layer opening.

10. The method of claim 1 wherein the step of forming a blooming barrier region further comprises horizontal rotation of the acute angle impurity implantation.

11. The method of claim 1 wherein the step of forming a blooming barrier region further comprises forming a photogenerated charge barrier region at a substrate depth lower than that of the blooming drain and the blooming barrier regions by the implantation of an impurity into the substrate at the first acute angle with the substrate, a lateral width of the photogenerated charge barrier region corresponding to the first acute implantation angle.

12. The method of claim 1 further comprising forming a photogenerated charge barrier region at a substrate depth lower than that of the blooming drain and the blooming barrier region by implanting an impurity into the substrate at a second acute angle with the substrate, a lateral width of the photogenerated charge barrier region corresponding to the second acute implantation angle.

13. The method of claim 1 wherein the first acute implantation angle is selected to produce a blooming barrier region width that exhibits a short-channel effect.

14. A method of fabricating an impurity region in a semiconductor substrate comprising:
    forming a masking layer on the substrate;
    forming a sidewall in the masking layer at a substrate location for the impurity region,
    based on masking layer impurity implantation stopping power and masking layer sidewall profile, selecting an acute impurity implantation angle with the substrate that corresponds to a prespecified three-dimensional impurity region profile in the substrate; and
    implanting an impurity into the substrate at the selected acute impurity implantation angle to produce the prespecified impurity region profile in the substrate.

15. The method of claim 14 wherein the step of forming a masking layer comprises forming at least two stacked masking layers each characterized by a distinct impurity implantation stopping power.

16. The method of claim 14 wherein the step of forming a sidewall in the masking layer comprises forming in each masking layer a sidewall of a distinct, non-vertical profile.

17. The method of claim 14 wherein the step of forming a sidewall in the masking layer comprises forming in each masking layer an opening of a distinct size.

18. The method of claim 14 wherein the step of forming a sidewall comprises forming a sidewall characterized by a non-vertical profile.

19. The method of claim 14 wherein the step of forming a sidewall comprises forming an opening in the masking layer.

20. The method of claim 14 wherein the step of forming a sidewall comprises forming a masking mesa out of the masking layer.

21. The method of claim 14 wherein the step of implanting an impurity into the substrate further comprises horizontal rotation of the acute angle impurity implantation.

22. The method of claim 14 wherein the substrate is of a first conductivity type and the impurity implanted into the substrate is of a second conductivity type.

* * * * *